(12) United States Patent
Lee et al.

(10) Patent No.: US 12,713,757 B2
(45) Date of Patent: Aug. 18, 2026

(54) DISPLAY DEVICE AND MANUFACTURING METHOD THEREOF

(71) Applicant: Samsung Display Co., LTD., Yongin-si (KR)

(72) Inventors: Dong Hyun Lee, Yongin-si (KR); Si Joon Song, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 737 days.

(21) Appl. No.: 18/058,201

(22) Filed: Nov. 22, 2022

(65) Prior Publication Data

US 2023/0299247 A1 Sep. 21, 2023

(30) Foreign Application Priority Data

Feb. 25, 2022 (KR) ........................ 10-2022-0025350

(51) Int. Cl.

| | |
|---|---|
| ***H10H 29/856*** | (2025.01) |
| ***H05K 1/14*** | (2006.01) |
| ***H10D 86/40*** | (2025.01) |
| ***H10H 29/85*** | (2025.01) |
| ***H10W 42/00*** | (2026.01) |

(Continued)

(52) U.S. Cl.

CPC ........... *H10H 29/856* (2025.01); *H05K 1/147* (2013.01); *H10D 86/441* (2025.01); *H10H 29/857* (2025.01); *H10W 42/121* (2026.01); *H10W 70/655* (2026.01); *H05K 2201/10128* (2013.01); *H10D 86/40* (2025.01); *H10H 29/20* (2025.01)

(58) Field of Classification Search

CPC ............... H10H 20/856; H10H 20/034; H10H 20/0362; H10H 20/84; H01L 2224/83874; H01L 2224/8322; H01L 2224/83007; H01L 2224/30517; H01L 2224/2919; H01L 2224/29016; H01L 2224/26155; H01L 2224/26122

See application file for complete search history.

(56) References Cited

U.S. PATENT DOCUMENTS

| | | | | |
|---|---|---|---|---|
| 10,566,554 B2 | 2/2020 | Li et al. | | |
| 2008/0188157 A1* | 8/2008 | Tashiro | ................ | G02F 1/1339 445/25 |

(Continued)

FOREIGN PATENT DOCUMENTS

| | | |
|---|---|---|
| JP | 4623613 B2 | 2/2011 |
| JP | 2015-094905 A | 5/2015 |

(Continued)

OTHER PUBLICATIONS

Korean Notice of Allowance for KR Application No. 10-2022-0025350, dated May 20, 2026, 7 pages.

*Primary Examiner* — Ratisha Mehta
*Assistant Examiner* — Adam Joseph Mott
(74) *Attorney, Agent, or Firm* — Womble Bond Dickinson (US) LLP

(57) ABSTRACT

A display device includes: a display layer on a substrate, the display layer including a light emitting element; a reflective structure on the display layer; a resin part on the display layer; a cover part on the resin part; and a driving circuit board, at least a portion of the driving circuit board being on a side of the display layer. The reflective structure includes a reflective surface facing the at least the portion of the driving circuit board.

21 Claims, 31 Drawing Sheets

(51) Int. Cl.
*H10W 70/655* (2026.01)
*H10H 29/20* (2026.01)

(56) References Cited

U.S. PATENT DOCUMENTS

| | | | | |
|---|---|---|---|---|
| 2011/0242467 | A1* | 10/2011 | Kim | H10K 59/8792 349/113 |
| 2015/0185527 | A1* | 7/2015 | Chang | H10K 59/8722 349/12 |
| 2022/0406975 | A1* | 12/2022 | Lee | G06F 1/1652 |
| 2023/0154906 | A1* | 5/2023 | Lee | H10W 90/00 257/211 |
| 2023/0163246 | A1* | 5/2023 | Lee | H10H 20/84 257/79 |
| 2023/0189590 | A1* | 6/2023 | Choi | H10K 59/00 |

FOREIGN PATENT DOCUMENTS

| | | | |
|---|---|---|---|
| KR | 10-2019-0123830 | A | 11/2019 |
| KR | 10-2020-0099223 | A | 8/2020 |
| KR | 10-2022-0007818 | A | 1/2022 |

* cited by examiner

FIG. 5

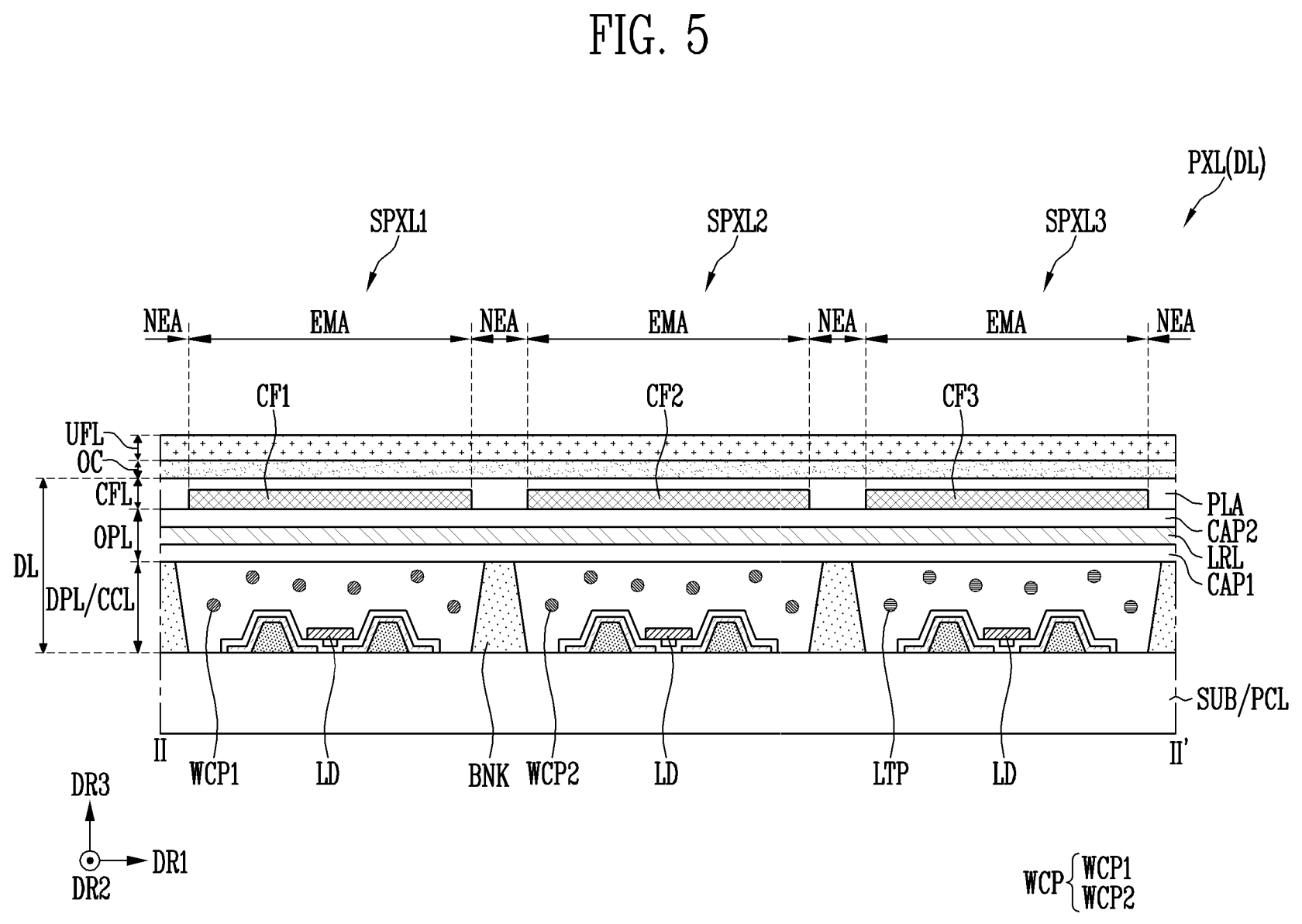

PXL(DL)
SPXL1
SPXL2
SPXL3
NEA
EMA
CF1
CF2
CF3
PLA
CAP2
LRL
CAP1
SUB/PCL
II
II'
LD
LTP
WCP1
WCP2
BNK
WCP{WCP1, WCP2}
UFL
OC
CFL
OPL
DPL/CCL
DL
DR1
DR2
DR3

CV(DF)
RL
RES
III'
CRD
COF
DCB
FPCB
ACF
NDA
FA
BS
RS
CAV
PS
DA
III
UFL
OC
DL
DR3

FIG. 23

DCB
COF
FPCB
CRD
ACF
RS
DL
OC
UFL
RL
DF
CAF
DR3

FIG. 26

2000
RES
RL
DF
CAF
CRD
COF
DCB
FPCB
ACF
EA2
RS
DL
OC
UFL
DR3

FIG. 28

DISPLAY DEVICE AND MANUFACTURING METHOD THEREOF

CROSS-REFERENCE TO RELATED APPLICATION

This application claims priority to and the benefit of Korean patent application No. 10-2022-0025350 filed on Feb. 25, 2022 in the Korean Intellectual Property Office (KIPO), the entire disclosure of which is incorporated by reference herein.

BACKGROUND

1. Field

The present disclosure generally relates to a display device and a manufacturing method thereof.

2. Related Art

Recently, as interest in information displays is increased, research and development of display devices have been continuously conducted.

SUMMARY

Aspects of one or more embodiments of the present disclosure are directed to a display device and a manufacturing method thereof, which are capable of preventing or reducing a risk that resin will be uncured.

In accordance with one or more embodiments of the present disclosure, a display device includes: a display layer on a substrate, the display layer including a light emitting element; a reflective structure on the display layer; a resin part on the display layer; a cover part on the resin part; and a driving circuit board, at least a portion of the driving circuit board being on a side of the display layer. The reflective structure includes a reflective surface facing the at least the portion of the driving circuit board.

The display device may further include an overcoat layer on the display layer. In a plan view, the reflective structure may overlap the overcoat layer, the resin part, and the cover part. In a plan view, the reflective structure may not overlap with the portion of the driving circuit board on the display layer.

The driving circuit board may include a chip on film having an end connected to the display layer, and a flexible circuit board connected to another end of the chip on film, the flexible circuit board being on a back surface of the display layer. A portion of the chip on film on the display layer may be spaced from the display layer to form a step difference area. A portion of the resin part may be in the step difference area.

The display device may include a display area and a non-display area. The non-display area may include a fan-out area. The fan-out area may be between the display area and the driving circuit board. Lines in the fan-out area may electrically connect the driving circuit board and lines in the display area to each other. The reflective structure may overlap with the fan-out area in a plan view.

The cover part may include a chassis.

The cover part may include an outer layer. The outer layer may include: a first outer layer including a polymer material; a second outer layer including a light blocking material, the second outer layer being on the first outer layer; and a third outer layer including an inorganic material, the third outer layer being on the second outer layer.

The reflective structure may include: an insulating pattern on the substrate, the insulating pattern protruding in a thickness direction of the substrate; and a reflective electrode on the insulating pattern.

The reflective structure includes a first reflective structure and a second reflective structure adjacent to the first reflective structure. The reflective electrode of the first reflective structure and the reflective electrode of the second reflective structure may be connected to each other.

The reflective structure may include a first transparent electrode layer on the reflective electrode and a second transparent electrode on the first transparent electrode layer.

An outer surface of the insulating pattern may have a curved shape. The reflective electrode may have a shape corresponding to the outer surface of the insulating pattern.

An outer surface of the insulating pattern may have a polygonal shape. The reflective electrode may have a shape corresponding to the outer surface of the insulating pattern.

The display layer may include: a pixel circuit layer including an auxiliary electrode layer, a gate electrode, and a transistor electrode on the substrate; and a display element layer on the pixel circuit layer, the display element layer including the light emitting element. The reflective structure may include a lower reflective structure on the substrate. The lower reflective structure may include a first reflective layer including a same material as the auxiliary electrode layer, a second reflective layer including a same material as the gate electrode, and a third reflective layer including a same material as the transistor electrode.

The display layer may include: a pixel circuit layer on the substrate, the pixel circuit layer including a pixel circuit; and a display element layer on the pixel circuit layer, the display element layer including alignment electrodes and the light emitting element. The light emitting element may be aligned between the alignment electrodes. The alignment electrodes and the reflective electrode may include a same material.

The reflective structure may include a cushion layer protruding in a thickness direction of the substrate and a reflective film over the cushion layer, the cushion layer having an elastic property.

The display device may further include an overcoat layer on the display layer. The reflective structure may further include an insulating film on the reflective film and an adhesive film on the insulating film. The adhesive film may enable UV light to be transmitted therethrough. The adhesive film may be in contact with the overcoat layer.

The cushion layer may have a polygonal shape.

The display device may further include: a reflective layer on the cover part; and an adhesive layer on the reflective layer.

The reflective structure may include a reflective film protruding in a thickness direction of the substrate.

The reflective structure may include an ink structure protruding in a thickness direction of the substrate, the ink structure including silver.

The display device may further include: an overcoat layer on the display layer; and an adhesive member on the overcoat layer. The adhesive member may contact the reflective structure.

In accordance with one or more embodiments of the present disclosure, a method of manufacturing a display device includes: providing a display layer including a light emitting element on a substrate; disposing at least a portion of a driving circuit board on the display layer; providing a reflective structure; disposing a cover part on a carrier member; moving the carrier member to be adjacent to the display layer; providing a resin part; and curing the resin part. The reflective structure includes a reflective surface facing a portion of the driving circuit board on the display layer.

The reflective structure may include: an insulating pattern on the substrate, the insulating pattern protruding in a thickness direction of the substrate; and a reflective electrode on the insulating pattern.

The providing of the reflective structure may include: disposing an insulating pattern on the substrate; and disposing a reflective electrode on the insulating pattern.

The providing of the reflective structure may include disposing the reflective structure on the cover part.

The method may further include disposing an overcoat layer on the display layer. The moving of the carrier member to be adjacent to the display layer may include contacting the reflective structure and the overcoat layer with each other.

The method may further include disposing an outer film layer on the overcoat layer. The moving of the carrier member to be adjacent to the display layer may include forming a cavity between the reflective structure and the outer film layer. The reflective structure may separate (e.g., may fluidly separate) the cavity and an adjacent area of the reflective structure, in which the cavity is not located, from each other.

The providing of the resin part may include providing the resin part to a space between the display layer and the cover part.

The providing of the resin part may include disposing the resin part on the cover part. The disposing of the resin part on the cover part may be performed earlier than the moving of the carrier member to be adjacent to the display layer.

The curing of the resin part may include emitting, by a resin curing device, UV light to the resin part. The UV light may be provided toward the reflective structure from the driving circuit board.

In accordance with one or more embodiments of the present disclosure, there is provided a display device manufactured by the method.

In accordance with one or more embodiments of the present disclosure, a display device including a display area and a non-display area includes: a pixel in the display area; a driving circuit board electrically connected to the pixel; a fan-out line electrically connecting the driving circuit board and the pixel to each other; a reflective structure on a substrate; a resin part on the substrate, the resin part overlapping with the reflective structure in a plan view; and a cover part on the resin part. The fan-out line overlaps the non-display area and is in a fan-out area at one side of the display area. The fan-out area has a shape widened along one direction. The reflective structure overlaps the fan-out area in a plan view, and includes a reflective surface facing a portion of the driving circuit board on a display layer.

BRIEF DESCRIPTION OF THE DRAWINGS

FIG. 5 is a schematic sectional view taken along the line II-II' shown in FIG. 2.

FIGS. 23 to 31 are process sectional views illustrating a manufacturing method of a display device in accordance with one or more embodiments of the present disclosure.

DETAILED DESCRIPTION

Figure 1:
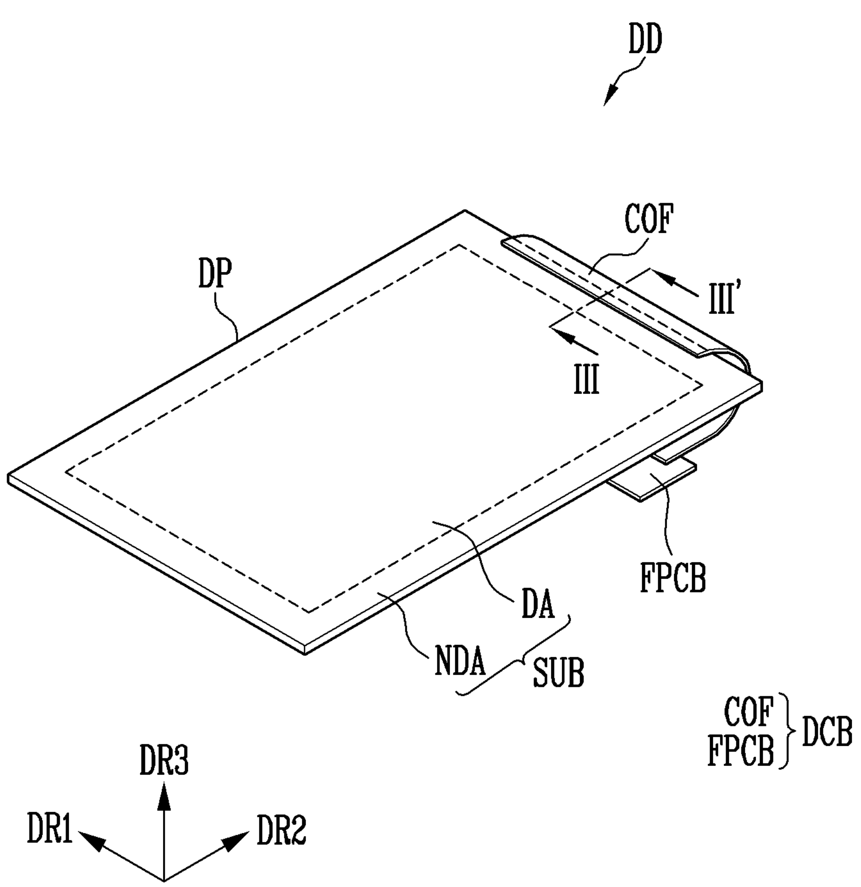
FIG. 1 is a perspective view schematically illustrating a display device in accordance with one or more embodiments of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. For example, in the drawings, the relative sizes of elements, layers, and regions may be exaggerated and/or simplified for clarity. Spatially relative terms, such as "beneath," "below," "lower," "above," "upper," "bottom," "top," and the like, may be used herein for ease of description to describe one element or feature's relationship to another element(s) or feature(s) as illustrated in the drawings. It will be understood that the spatially relative terms are intended to encompass different orientations of the device in use or operation in addition to the orientation depicted in the drawings. For example, if the device in the drawings is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

It will be understood that when an element is referred to as being "between" two elements, it can be the only element between the two elements, or one or more intervening elements may also be present. Like reference numerals refer to like elements throughout, and duplicative descriptions thereof may not be provided.

The terminology used herein is for the purpose of describing particular embodiments only and is not intended to limit the embodiments described herein.

Although specific embodiments are illustrated in the drawings and described in detail in the text, the present disclosure is not limited thereto because embodiments of the present disclosure can include various changes and have various forms. As such, embodiments of the present disclosure are not limited to a specific form, and it should be understood that all suitable modifications, equivalents, and substitutions are included within the spirit and scope of the present disclosure. By way of example, one or more features of any embodiment described herein may be substituted with corresponding suitable features of one or more embodiments without departing from the spirit and scope of the present disclosure.

As used herein, the singular forms "a," "an," and "the" are intended to include the plural forms as well, unless the context clearly indicates otherwise.

As used herein, expressions such as "at least one of," "one of," and "selected from," when preceding a list of elements, modify the entire list of elements and do not modify the individual elements of the list.

As used herein, the term "and/or" includes any and all combinations of one or more of the associated listed items.

Further, the use of "may" when describing embodiments of the present disclosure refers to "one or more embodiments of the present disclosure."

It will be understood that, although the terms "first", "second", etc. may be used herein to describe various elements, these elements should not be limited by these terms. These terms are only used to distinguish one element from another element. Thus, a "first" element discussed below could also be termed a "second" element without departing from the teachings of the disclosure. As used herein, the singular forms are intended to include the plural forms as well, unless the context clearly indicates otherwise.

It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof. Further, an expression that an element such as a layer, region, substrate or plate is placed "on" or "above" another element indicates not only a case where the element is placed "directly on" or "just above" the other element but also a case where a further element is interposed between the element and the other element. On the contrary, an expression that an element such as a layer, region, substrate or plate is placed "beneath" or "below" another element indicates not only a case where the element is placed "directly beneath" or "just below" the other element but also a case where a further element is interposed between the element and the other element.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

The present disclosure generally relates to a display device and a manufacturing method thereof. Hereinafter, a display device and a manufacturing method thereof in accordance with one or more embodiments of the present disclosure will be described with reference to the accompanying drawings.

Figure 2:
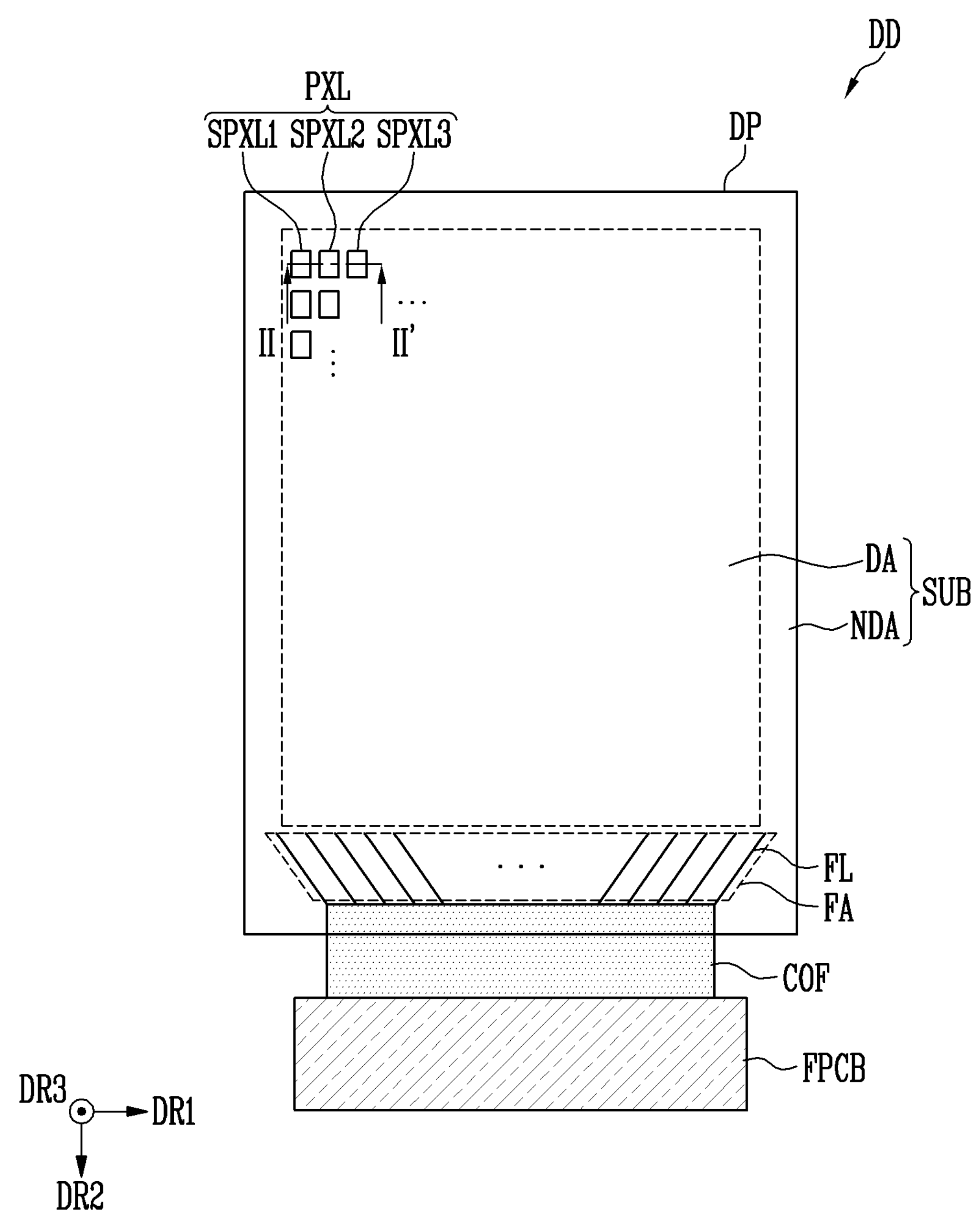
FIG. 2 is a plan view schematically illustrating the display device in accordance with one or more embodiments of the present disclosure.

FIG. 1 is a perspective view schematically illustrating a display device in accordance with one or more embodiments of the present disclosure. FIG. 2 is a plan view schematically illustrating the display device in accordance with one or more embodiments of the present disclosure.

Referring to FIGS. 1 and 2, the display device DD is configured to provide light. The display device DD may include pixels PXL capable of providing light.

The display device DD may include a display panel DP and a driving circuit board DCB.

The display panel DP may include a substrate SUB, the pixels PXL, a driver, and a line part. The driver may include a scan driver, an emission driver, and a data driver.

The substrate SUB may form (or constitute) a base surface of the display device DD. The substrate SUB may include a rigid material or a flexible material according to a purpose of the display device DD. The substrate SUB may include a flexible or rigid substrate or film. However, the material of the substrate SUB applied to one or more embodiments of the present disclosure are not limited to a specific example.

The substrate SUB may include a display area DA and a non-display area NDA. In the display area DA, light may be provided. In the display area DA, the light may be emitted in a display direction of the display device DD (e.g., a third direction DR3). In the non-display area NDA, the light may not be provided.

The pixel PXL may be disposed on the substrate SUB, and include a light emitting element (e.g., see 'LD' shown in FIG. 3), thereby emitting light. The pixel PXL may be disposed in the display area DA of the substrate SUB. The display area DA may be an area in which the pixel PXL is provided. The non-display area NDA may be an area in which the pixel PXL is not provided. For example, the non-display area NDA may be an area in which no pixels are provided.

In accordance with one or more embodiments, the pixels PXL may be arranged in a matrix form along rows extending in a first direction DR1 and columns extending in a second direction DR2. For example, the pixels PXL may be arranged according to a stripe arrangement structure, an RGBG or PENTILE® (PENTILE® is a registered trademark of Samsung Display Co., Ltd., Republic of Korea) arrangement structure, and/or the like. However, the arrangement structure of the pixels PXL is not limited thereto, and the pixels PXL may be arranged in the display area DA according to various suitable structures and/or various suitable manners.

The pixel PXL may include a plurality of sub-pixels. For example, the pixel PXL may include a first sub-pixel SPXL1, a second sub-pixel SPXL2, and a third sub-pixel SPXL3. At least one first sub-pixel SPXL1, at least one second sub-pixel SPXL2, and at least one third sub-pixel SPXL3 may form (or constitute) one pixel unit capable of emitting lights of various colors.

For example, each of the first sub-pixel SPXL1, the second sub-pixel SPXL2, and the third sub-pixel SPXL3 may emit light of a color (e.g., a predetermined color). For example, the first sub-pixel SPXL1 may be a red sub-pixel emitting light of a red color (e.g., a first color), the second sub-pixel SPXL2 may be a green sub-pixel emitting light of a green color (e.g., a second color), and the third sub-pixel SPXL3 may be a blue sub-pixel emitting light of a blue color (e.g., a third color).

However, the colors, kinds, and/or numbers of first to third sub-pixels SPXL1, SPXL2, and SPXL3 forming (or constituting) each pixel unit are not limited to a specific example.

In one or more embodiments, the driver may be disposed in the non-display area NDA in a plan view. One of the scan driver, the emission driver, and the data driver may be disposed together with the line part in the non-display area NDA. In accordance with one or more embodiments, the driver may be disposed in the display panel DP. The driver may be mounted on the driving circuit board DCB. The position of the driver is not necessarily limited to a specific example.

The driver may provide (or output) electrical information (or a signal) provided to the pixel PXL. When electrical information is provided to the pixel PXL, the light emitting element LD included in the pixel PXL may emit light.

The scan driver may transfer a scan signal to the pixel PXL along a scan line. The emission driver may provide an emission control signal to the pixel PXL along an emission control line. The data driver may provide a data signal to the pixel PXL along a data line.

The line part may be disposed in the non-display area NDA in a plan view. The line part may connect (e.g., electrically connect) the driver and the pixel PXL to each other.

The line part may include fan-out lines FL disposed in a fan-out area FA. The fan-out area FA may overlap with the non-display area NDA in a plan view.

The fan-out area FA may be disposed at one side of the display area DA. The fan-out area FA may be disposed in the non-display area NDA. The fan-out area FA may be disposed between the display area DA and a chip on film COF. The fan-out lines FL may connect (e.g., electrically connect) the driving circuit board DCB and the pixels PXL in the display area DA to each other.

The fan-out area FA may have a shape widened along one direction. For example, the fan-out area FA may have different widths along the first direction DR1. The fan-out area FA may be widened toward the display area DA from the chip on film COF.

The driving circuit board DCB may include the chip on film COF and a flexible circuit board FPCB.

The chip on film COF may provide an electrical signal acquired based on a signal applied from the flexible circuit board FPCB to the display panel DP (e.g., a display layer (e.g., see 'DL' shown in FIG. 3)).

One end of the chip on film COF may be connected (or attached) to the display panel DP, and the other end of the chip on film COF may be connected (or attached) to the flexible circuit board FPCB. At least a portion of the chip on film COF may be bent.

The chip on chip COF may include an insulating film and a plurality of lines provided on the insulating film. The chip on film COF generally refers to a form in which an insulating film configured as a thin film and lines are formed on the insulating film are formed, and may be designated as a tape carrier package, a flexible printed circuit board, and/or the like. In the chip on film COF, a semiconductor chip connected to at least some of the lines may be further mounted on the insulating film.

A circuit element configured to process an electrical signal to be applied to the display layer (e.g., see 'DL' shown in FIG. 3) may be disposed on the flexible circuit board FPCB.

The flexible circuit board FPCB may be disposed on one surface or a back surface of the display panel DP. One end portion of the flexible circuit board FPCB may be connected to the chip on film COF having a curved shape to be disposed on the back surface of the display panel DP, and accordingly, the flexible circuit board FPCB is not viewed from the outside.

Figure 3:
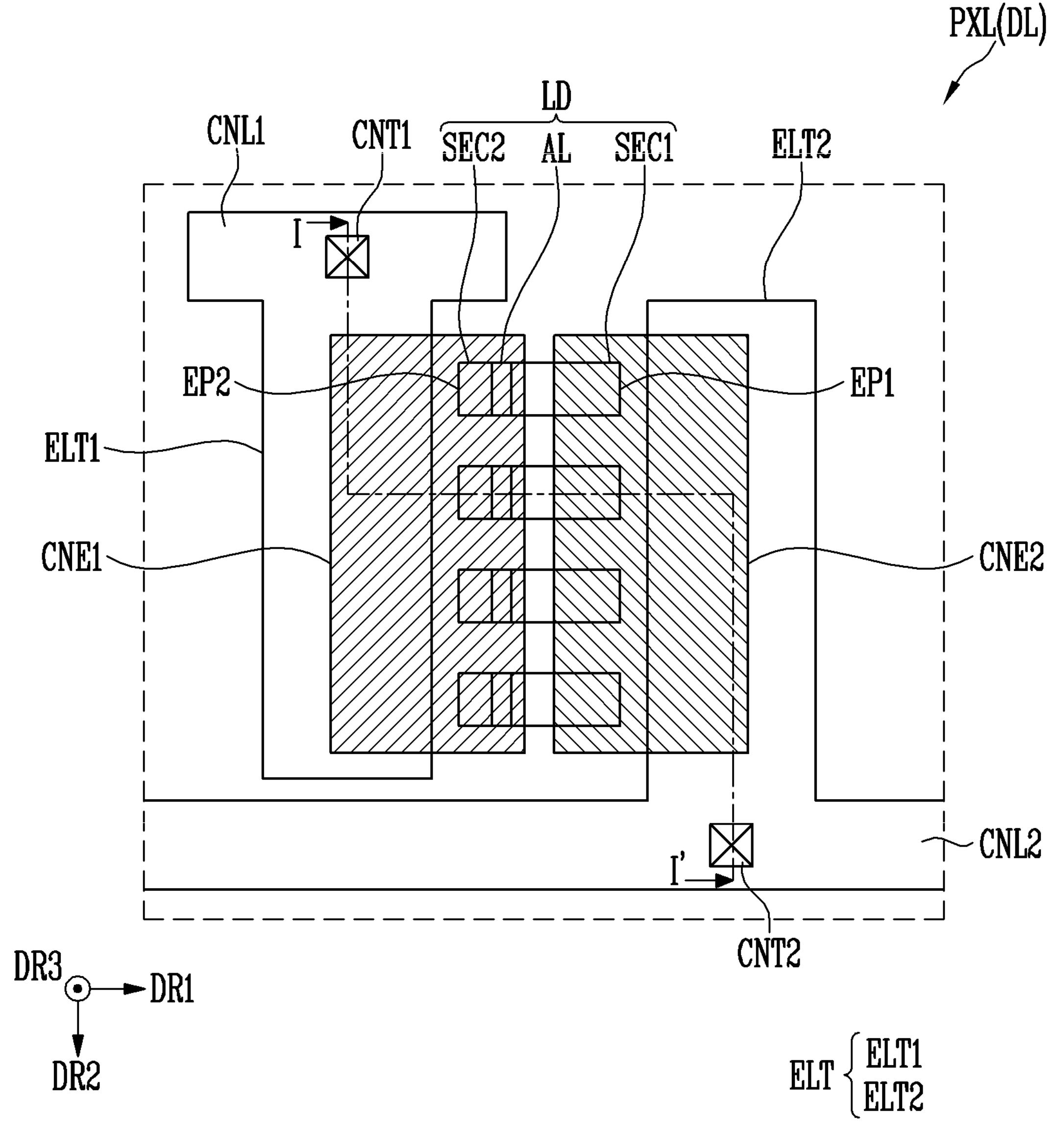
FIG. 3 is a plan view schematically illustrating a pixel in accordance with one or more embodiments of the present disclosure.

FIG. 3 is a plan view schematically illustrating a pixel in accordance with one or more embodiments of the present disclosure. FIG. 3 illustrates a pixel PXL included in a display layer DL in accordance with one or more embodiments of the present disclosure.

The display layer DL may refer to a layer including light emitting elements LD. For example, the display layer DL may be a layer disposed at one side of the display panel DP, to emit light. In accordance with one or more embodiments, the display panel DP including the display layer DL may be implemented as a self-luminous display panel such as an organic light emitting display panel. However, when the display panel DP is implemented as a self-luminous display panel, the present disclosure is not limited to a case where each pixel necessarily includes only an organic light emitting element. For example, a light emitting element of each pixel may be configured as an organic light emitting diode, an inorganic light emitting diode, a quantum dot/well light emitting diode, and/or the like. In one or more embodiments, the display panel DP may be implemented as a non-light-emitting display panel such as a liquid crystal display panel. When the display panel DP is implemented as a non-light-emitting display panel, the display device DD may additionally include a light source such as a back-light unit. Hereinafter, for convenience of description, an embodiment in which the display panel DP includes a quantum dot/well light emitting element will be primarily described.

Referring to FIG. 3, the pixel PXL may include a reflective electrode ELT, a first connection electrode CNL1, the second connection electrode CNL2, a first contact part CNT1, a second contact part CNT2, a light emitting element LD, a first contact electrode CNE1, and a second contact electrode CNE2. The reflective electrode ELT may include a first electrode ELT1 and a second electrode ELT2. The reflective electrode ELT disposed in the display area DA may be designated as an alignment electrode.

The light emitting element LD may include a first semiconductor layer SEC1, a second semiconductor layer SEC2, and an active layer AL interposed between the first semiconductor layer SEC1 and the second semiconductor layer SEC2.

The light emitting element LD may have a first end portion EP1 and a second end portion EP2. The first semiconductor layer SEC1 may be adjacent to the first end portion EP1 of the light emitting element LD. The second semiconductor layer SEC2 may be adjacent to the second end portion EP2 of the light emitting element LD.

In accordance with one or more embodiments, the light emitting element LD may have a pillar shape. The pillar shape may refer to a shape extending in a length direction of the light emitting element LD, such as a cylinder or a polyprism. For example, a length of the light emitting element LD may be greater than a diameter (or a width of a cross-sectional surface) of the light emitting element LD. The shape of a section of the light emitting element LD may include a rod-like shape and a bar-like shape, but the present disclosure is not limited thereto.

The light emitting element LD may have a size of nanometer scale to micrometer scale.

The first semiconductor layer SEC1 may be a first conductivity type semiconductor layer. For example, the first semiconductor layer SEC1 may include an N-type semiconductor layer. For example, the first semiconductor layer SEC1 may include any one semiconductor material among InAlGaN, GaN, AlGaN, InGaN, AlN, and InN, and include an N-type semiconductor layer doped with a first conductivity type dopant such as silicon (Si), germanium (Ge) or tin (Sn). However, the material constituting the first semiconductor layer SEC1 is not limited thereto. In one or more embodiments, the first semiconductor layer SEC1 may be formed (or configured) with various suitable materials.

The active layer AL may be disposed on the first semiconductor layer SEC1. The active layer may be disposed between the first semiconductor layer SEC1 and the second semiconductor layer SEC2.

The active layer AL may include any one of AlGaInP, AlGaInP, AlInGaN, InGaN, and AlGaN. For example, when the active layer AL is to output red light, the active layer AL may include AlGaInP and/or InGaN. When the active layer AL is to output green light or blue light, the active layer AL may include InGaN. However, the present disclosure is not limited to the above-described example.

The active layer AL may be formed in a single-quantum well structure or a multi-quantum well structure.

The second semiconductor layer SEC2 is disposed on the active layer AL, and may include a semiconductor layer having a type different from the type of the first semiconductor layer SEC1. For example, the second semiconductor layer SEC2 may include a P-type semiconductor layer. For example, the second semiconductor layer SEC2 may include at least one semiconductor material among InAlGaN, GaN, AlGaN, InGaN, AlN, and InN, and include a P-type semiconductor layer doped with a second conductivity type dopant such as magnesium (Mg). However, the material constituting the second semiconductor layer SEC2 is not limited thereto. In one or more embodiments, the second semiconductor layer SEC2 may be configured with various suitable materials.

When a voltage greater than or equal to a threshold voltage is applied to both ends of the light emitting element LD, electron-hole pairs are combined in the active layer AL.

In one or more embodiments, the light emitting element LD may further include an element insulative film provided on a surface thereof. The element insulative film may be formed with a single film or a plurality of films. The element insulative film may expose both the ends portions of the light emitting element LD, which have different polarities.

In accordance with one or more embodiments, the element insulative film may include at least one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the present disclosure is not limited to a specific example.

In accordance with one or more embodiments, the light emitting element LD may further include an additional component in addition to the first semiconductor layer SEC1, the active layer AL, and the second semiconductor layer SEC2. For example, the light emitting elements LD may further include a phosphor layer, an active layer, a semiconductor layer, and/or an electrode layer.

The light emitting element LD may be provided in a plurality to be arranged. For example, the light emitting elements LD may be arranged in a parallel structure along the second direction DR2. However, the arrangement structure of the light emitting element LD is not limited thereto.

The light emitting element LD may be disposed between electrodes configured to serve as alignment electrodes. For example, the light emitting element LD may be disposed between the first electrode ELT1 and the second electrode ELT2. The light emitting element LD may be disposed on the first electrode ELT1 and the second electrode ELT2. At least a portion of the light emitting element LD may be disposed between the first electrode ELT1 and the second electrode ELT2 in a plan view.

The light emitting element LD may be connected (e.g., electrically connected) to the first electrode ELT1 through the first contact electrode CNE1.

In accordance with one or more embodiments, the second end portion EP2 of the light emitting element LD may be connected (e.g., electrically connected) to the first contact electrode CNE1. Accordingly, the second semiconductor layer SEC2 of the light emitting element LD may be connected (e.g., electrically connected) to the first electrode ELT1 and the first contact electrode CNE1.

The light emitting element LD may be connected (e.g., electrically connected) to the second electrode ELT2 through the second contact electrode CNE2.

In accordance with one or more embodiments, the first end portion EP1 of the light emitting element LD may be connected (e.g., electrically connected) to the second contact electrode CNE2. Accordingly, the first semiconductor layer SEC of the light emitting element LD may be connected (e.g., electrically connected) to the second electrode ELT2 and the second contact electrode CNE2.

The first electrode ELT1 may extend in the second direction DR2. The first electrode ELT1 may be spaced from the second electrode ELT2 in the first direction DR1. The first electrode ELT1 may be connected to the first connection electrode CNL1. The first direction DR1 may be different from the second direction DR2.

The first connection electrode CNL1 may be connected to a bridge pattern (e.g., see 'BRP' shown in FIG. 4) included in a pixel circuit layer (e.g., see 'PCL' shown in FIG. 4) through the first contact part CNT1. The first connection electrode CNL1 may be disposed in the same layer as the first electrode ELT1 so that the first connection electrode CNL1 and the first electrode ELT1 are integrally formed. For example, the first connection electrode CNL1 and the first electrode ELT1 may be formed as a single monolithic structure.

The second electrode ELT2 may extend in the second direction DR2. The second electrode ELT2 may be spaced from the first electrode ELT1 in the first direction DR1. The second electrode ELT2 may be connected to the second connection electrode CNL2.

The second connection electrode CNL2 may be connected to a power line (e.g., see 'PL' shown in FIG. 4) included in the pixel circuit layer PCL through the second contact part CNT2. The second connection electrode CNL2 may be disposed in the same layer as the second electrode ELT2 so that the second connection electrode CNL2 and the second electrode ELT2 are integrally formed. For example, the second connection electrode CNL2 and the second electrode ELT2 may be formed as a single monolithic structure.

The first contact electrode CNE1 may be disposed on the first electrode ELT1, to be connected (e.g., electrically connected) to the first electrode ELT1. The first contact electrode CNE1 may connect (e.g., electrically connect) the first electrode ELT1 and the light emitting element LD to each other.

The second contact electrode CNE2 may be disposed on the second electrode ELT2, to be connected (e.g., electrically connected) to the second electrode ELT2. The second contact electrode CNE2 may connect (e.g., electrically connect) the second electrode ELT2 and the light emitting element LD to each other.

Figure 4:
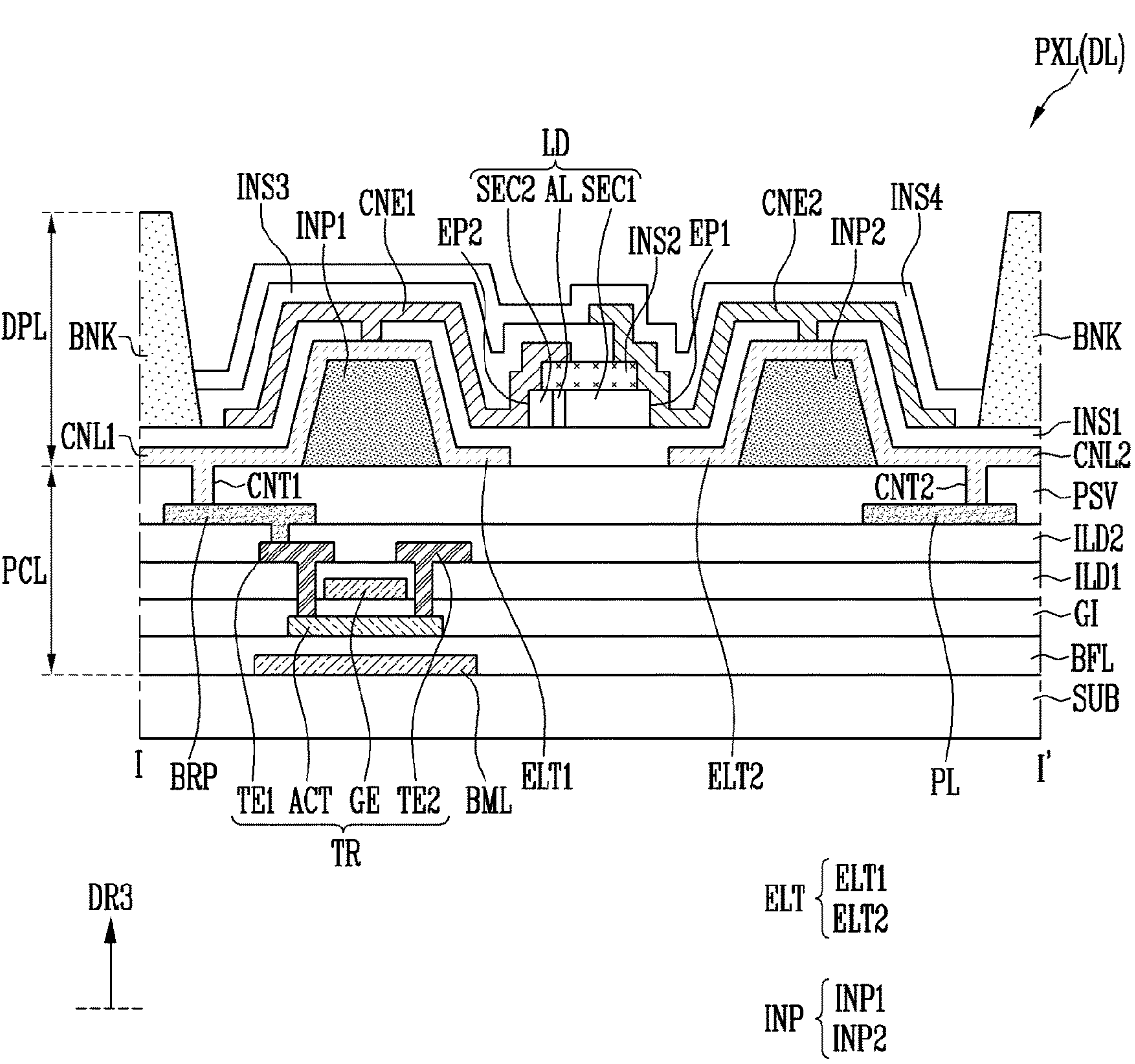
FIG. 4 is a schematic sectional view taken along the line I-I' shown in FIG. 3.

Hereinafter, a sectional structure of the pixel PXL in accordance with one or more embodiments of the present disclosure will be primarily described with reference to FIGS. 4 and 5. FIG. 4 is a view illustrating a stacked structure including the display layer DL in accordance with one or more embodiments of the present disclosure, and schematically illustrates a section of the pixel PXL. FIG. 5 is a view illustrating a display panel DP including the display layer DL in accordance with one or more embodiments of the present disclosure, and schematically illustrates a section of the pixel PXL.

FIG. 4 is a schematic sectional view taken along the line I-I' shown in FIG. 3. FIG. 5 is a schematic sectional view taken along the line II-II' shown in FIG. 2.

Referring to FIG. 4, the display layer DL (or the pixel PXL) may include a substrate SUB, a pixel circuit layer PCL, and a display element layer DPL.

The substrate SUB may constitute a base member of the display device DD. The substrate SUB may be a rigid or flexible substrate or film, but the present disclosure is not limited to a specific example. The substrate SUB may be provided as a base surface so that the pixel circuit layer PCL and the display element layer DPL are disposed on the substrate SUB.

The pixel circuit layer PCL may be disposed on the substrate SUB. The pixel circuit layer PCL may include an auxiliary electrode layer BML, a buffer layer BFL, a transistor TR, a gate insulating layer GI, a first interlayer insulating layer ILD1, a second interlayer insulating layer ILD2, a bridge pattern BRP, a power line PL, a protective layer PSV, a first contact part CNT1, and a second contact part CNT2.

The auxiliary electrode layer BML may be disposed on the substrate SUB, to be covered by the buffer layer BFL. A portion of the auxiliary electrode layer BML may overlap with the transistor TR in a plan view.

In accordance with one or more embodiments, the auxiliary electrode layer BML may include a conductive material, thereby serving as a path through which an electrical signal provided to the pixel circuit layer PCL and the display element layer DPL moves. For example, the auxiliary electrode layer BML may include any one of aluminum (Al), copper (Cu), titanium (Ti), and molybdenum (Mo).

The buffer layer BFL may be located on the substrate SUB. The buffer layer BFL may prevent or substantially prevent an impurity from being diffused from the outside. The buffer layer BFL may include one of silicon nitride ($SiN_x$), silicon oxide ($SiO_x$), silicon oxynitride ($SiO_xN_y$), and aluminum oxide ($AlO_x$).

The transistor TR may be a thin film transistor. In accordance with one or more embodiments, the transistor TR may be a driving transistor.

The transistor TR may be connected (e.g., electrically connected) to a light emitting element LD. The transistor TR may be connected (e.g., electrically connected) to the bridge pattern BRP. However, the present disclosure is not limited to the above-described example. In an example, the transistor TR may be connected (e.g., electrically connected) to a first connection electrode CNL1 without passing through the bridge pattern BRP.

The transistor TR may include an active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include one of Low Temperature Polycrystalline Silicon (LTPS), poly-silicon, amorphous silicon, and an oxide semiconductor.

The active layer ACT may include a first contact region in contact with the first transistor electrode TE1 and a second contact region in contact with the second transistor electrode TE2. The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate electrode GE may be disposed on the gate insulating layer GI. A position of the gate electrode GE may correspond to that of the channel region of the active layer ACT. For example, the gate electrode GE may be disposed on the channel region of the active layer ACT with the gate insulating layer GI interposed therebetween. In an example, the gate electrode GE may include one of aluminum (Al), copper (Cu), titanium (Ti), and molybdenum (Mo).

The gate insulating layer GI may be disposed over the active layer ACT. The gate insulating layer GI may include an inorganic material. In an example, the gate insulating layer GI may include one of silicon nitride ($SiN_x$), silicon oxide ($SiO_x$), silicon oxynitride ($SiO_xN_y$), and aluminum oxide ($AlO_x$).

The first interlayer insulating layer ILD1 may be located over the gate electrode GE. Like the gate insulating layer GI, the first interlayer insulating layer ILD1 may include at least one of silicon nitride ($SiN_x$), silicon oxide ($SiO_x$), silicon oxynitride ($SiO_xN_y$), and aluminum oxide ($AlO_x$).

The first transistor electrode TE1 and the second transistor electrode TE2 may be located on the first interlayer insulating layer ILD1. The first transistor electrode TE1 may be in contact with the first contact region of the active layer ACT while penetrating the gate insulating layer GI and the first interlayer insulating layer ILD1, and the second transistor electrode TE2 may be in contact with the second contact region of the active layer ACT while penetrating the gate insulating layer GI and the first interlayer insulating layer ILD1. In an example, the first transistor electrode TE1 may be a drain electrode, and the second transistor electrode TE2 may be a source electrode. However, the present disclosure is not limited thereto.

The second interlayer insulating layer ILD2 may be located over the first transistor electrode TE1 and the second transistor electrode TE2. Like the first interlayer insulating layer ILD1 and the gate insulating layer GI, the second interlayer insulating layer ILD2 may include an inorganic material. The inorganic material may include one of the example materials constituting the first interlayer insulating layer ILD1 and the gate insulating layer GI, e.g., silicon nitride ($SiN_x$), silicon oxide ($SiO_x$), silicon oxynitride ($SiO_xN_y$), and aluminum oxide ($AlO_x$).

The bridge pattern BRP may be disposed on the second interlayer insulating layer ILD2. The bridge pattern BRP may be connected to the first transistor electrode TE1 through a contact hole penetrating the second interlayer insulating layer ILD2. The bridge pattern BRP may be connected (e.g., electrically connected) to the first connection electrode CNL1 through the first contact part CNT1 formed in the protective layer PSV.

The power line PL may be disposed on the second interlayer insulating layer ILD2. The power line PL may be connected (e.g., electrically connected) to a second connection electrode CNL2 through the second contact part CNT2 formed in the protective layer PSV. The power line PL may provide a power source (or a cathode signal) to the light emitting element LD through a second electrode ELT2.

The protective layer PSV may be located on the second interlayer insulating layer ILD2. The protective layer PSV may cover the bridge pattern BRP and the power line PL. The protective layer PSV may be a via layer.

The protective layer PSV may be provided in a form including an organic insulating layer, an inorganic insulating layer, or the organic insulating layer disposed on the inorganic insulating layer. However, the present disclosure is not limited to the above-described example.

In accordance with one or more embodiments, the first contact part CNT1 connected to one region of the bridge pattern BRP and the second contact part CNT2 connected to one region of the power line PL may be formed in the protective layer PSV.

The display element layer DPL may be disposed on the pixel circuit layer PCL. The display element layer DPL may include an insulating pattern INP, a bank BNK, the first connection electrode CNL1, the second connection electrode CNL2, a reflective electrode ELT, a first insulating layer INS1, the light emitting element LD, a second insulating layer INS2, a first contact electrode CNE1, a second contact electrode CNE2, a third insulating layer INS3, and a fourth insulating layer INS4.

The insulating pattern INP may include a first insulating pattern INP1 and a second insulating pattern INP2. The first insulating pattern INP1 and the second insulating pattern INP2 may be disposed on the protective layer PSV. The first insulating pattern INP1 and the second insulating pattern INP2 may have a shape protruding in a thickness direction of the substrate SUB (e.g., the third direction DR3). In an example, the first insulating pattern INP1 and the second insulating pattern INP2 may include an organic material and/or an inorganic material, but the present disclosure is not limited thereto.

The bank BNK may be disposed on the first insulating layer INS1. The bank BNK may have a shape protruding in the display direction of the display device DD (e.g., the third direction DR3). The bank BNK may define a space in which an ink can be accommodated during an inkjet process for disposing the light emitting element LD.

The first connection electrode CNL1 and the second connection electrode CNL2 may be disposed on the protective layer PSV. The first connection electrode CNL1 may be connected to a first electrode ELT1. The first connection electrode CNL1 may be connected (e.g., electrically connected) to the bridge pattern BRP through the first contact part CNT1. The first connection electrode CNL1 may connect (e.g., electrically connect) the bridge pattern BRP and the first electrode ELT1 to each other. The second connection electrode CNL2 may be connected to a second electrode ELT2. The second connection electrode CNL2 may connected (e.g., electrically connected) to the power line PL through the second contact part CNT2. The second connection electrode CNL2 may connect (e.g., electrically connect) the power line PL and the second electrode ELT2.

The reflective electrode ELT may include the first electrode ELT1 and the second electrode ELT2. The first electrode ELT1 and the second electrode ELT2 may be disposed on the protective layer PSV. In accordance with one or more embodiments, at least a portion of the first electrode ELT1 may be arranged over the first insulating pattern INP1, and at least a portion of the second electrode ELT2 may be arranged over the second insulating pattern INP2, to each serve as a reflective partition wall.

The first electrode ELT1 may be connected (e.g., electrically connected) to the light emitting element LD. The first electrode ELT1 may be connected (e.g., electrically connected) to the first contact electrode CNE1 through a contact hole formed in the first insulating layer INS1. The first electrode ELT1 may apply an anode signal to the light emitting element LD.

The second electrode ELT2 may be connected (e.g., electrically connected) to the light emitting element LD. The second electrode ELT2 may be connected (e.g., electrically connected) to the second contact electrode CNE2 through a contact hole formed in the first insulating layer INS1. The second electrode ELT2 may apply a cathode signal (e.g., a ground signal) to the light emitting element LD.

The first electrode ELT1 and the second electrode ELT2 may include a conductive material. For example, the first electrode ELT1 and the second electrode ELT2 may include one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and alloys thereof. However, the present disclosure is not limited to the above-described example.

In accordance with one or more embodiments, the first electrode ELT1 and the second electrode ELT2 may serve as alignment electrodes of the light emitting element LD. For example, the light emitting element LD may be arranged based on an electrical signal provided from the first electrode ELT1 and the second electrode ELT2.

The first insulating layer INS1 may be disposed on the protective layer PSV. The first insulating layer INS1 may cover the first electrode ELT1 and the second electrode ELT2. The first insulating layer INS1 may stabilize connection between electrode components, and reduce external influence. The first insulating layer INS1 may include at least one of silicon oxide ($SiO_x$), silicon nitride ($SiN_x$), silicon oxynitride ($SiO_xN_y$), and aluminum oxide ($AlO_x$).

The light emitting element LD may be disposed on the first insulating layer INS1, to emit light, based on an electrical signal provided from the first contact electrode CNE1 and the second contact electrode CNE2.

The second insulating layer INS2 may be disposed on the light emitting element LD. The second insulating layer INS2 may cover the active layer AL of the light emitting element LD. In an example, the second insulating layer INS2 may include at least one of an organic material and an inorganic material.

The first contact electrode CNE1 and the second contact electrode CNE2 may be disposed on the first insulating layer INS1. The first contact electrodes CNE1 may connect (e.g., electrically connect) the first electrode ELT1 and the light emitting element LD to each other, and the second contact electrode CNE2 may connect (e.g., electrically connect) the second electrode ELT2 and the light emitting element LD to each other.

In accordance with one or more embodiments, the first contact electrode CNE1 may provide an anode signal to the light emitting element LD, and the second contact electrode CNE2 may provide a cathode signal to the light emitting element LD.

The first contact electrode CNE1 and the second contact electrode CNE2 may include a conductive material. In an example, the first contact electrode CNE1 may include a transparent conductive material including Indium Tin Oxide (ITO), Indium Zinc Oxide (IZO), and Indium Tin Zinc Oxide (ITZO), but the present disclosure is not limited thereto.

The third insulating layer INS3 may be disposed over the first contact electrode CNE1. The third insulating layer INS3 may include any one of the materials listed with reference to the first insulating layer INS1. In accordance with one or more embodiments of the present disclosure, a portion of the third insulating layer INS3 may be disposed between the first contact electrode CNE1 and the second contact electrode CNE2, to prevent or to substantially prevent the first contact electrode CNE1 and the second contact electrode CNE2 from being electrically short-circuited to each other.

The fourth insulating layer INS4 may be disposed on the first contact electrode CNE1, the second contact electrode CNE2, and the third insulating layer INS3. The fourth insulating layer INS4 may protect individual components of the display element layer DPL. In an example, the fourth insulating layer INS4 may include at least one of silicon oxide ($SiO_x$), silicon nitride ($SiN_x$), silicon oxynitride ($SiO_xN_y$), and aluminum oxide ($AlO_x$).

Next, layers included in the pixel PXL in accordance with another embodiment of the present disclosure will be described with reference to FIG. 5. For convenience of description, individual components of the pixel circuit layer PCL and the display element layer DPL are briefly discussed in reference to FIG. 5.

Referring to FIG. 5, the display layer DL (or the pixel PXL) may further include a color conversion layer CCL, an optical layer OPL, and a color filter layer CFL. The display panel DP (or the pixel PXL) may further include an overcoat layer OC and an outer film layer UFL, which are disposed on the display layer DL.

In accordance with one or more embodiments, light emitting elements LD disposed in each of the first sub-pixel SPXL1, the second sub-pixel SPXL2, and the third sub-pixel SPXL3 may emit light of the same color. For example, the first sub-pixel SPXL1, the second sub-pixel SPXL2, and the third sub-pixel SPXL3 may include light emitting elements LD emitting light of a third color (e.g., light of a blue color). The color conversion layer CCL and/or the color filter layer CFL may be provided in the first sub-pixel SPXL1, the second sub-pixel SPXL2, and the third sub-pixel SPXL3, to display a full-color image. However, the present disclosure is not necessarily limited thereto, and the first sub-pixel SPXL1, the second sub-pixel SPXL2, and the third sub-pixel SPXL3 may include light emitting elements LD emitting lights of different colors.

In accordance with one or more embodiments, the color conversion layer CCL may be disposed in the same layer as the display element layer DPL. For example, the color conversion layer CCL may be disposed between banks BNK.

The color conversion layer CCL may include a wavelength conversion pattern WCP and a light transmission pattern LTP. In an example, the wavelength conversion pattern WCP may include a first wavelength conversion pattern WCP1 and a second wavelength conversion pattern WCP2.

The first wavelength conversion pattern WCP1 may be disposed to overlap with an emission area EMA of the first sub-pixel SPXL1. For example, the first wavelength conversion pattern WCP1 may be provided between banks BNK, to overlap with the emission area EMA of the first sub-pixel SPXL1 in a plan view.

The second wavelength conversion pattern WCP2 may be disposed to overlap with an emission area EMA of the second sub-pixel SPXL2. For example, the second wavelength conversion pattern WCP2 may be provided between banks BNK, to overlap with the emission area EMA of the second sub-pixel SPXL2 in a plan view.

The light transmission pattern LTP may be disposed to overlap with an emission area EMA of the third sub-pixel SPXL3. For example, the light transmission patter LTP may be provided between banks BNK, to overlap with the emission area EMA of the third sub-pixel SPXL3 in a plan view.

In accordance with one or more embodiments, the first wave conversion pattern WCP1 may include first color conversion particles for converting light of a third color, which is emitted from a light emitting element LD, into light of a first color. In an example, when the light emitting element LD is a blue light emitting element emitting light of a blue color, and the first sub-pixel SPXL1 is a red pixel, the first wavelength conversion pattern WCP1 may include a first quantum dot for converting light of a blue color, which is emitted from the blue light emitting element, into light of a red color.

For example, the first wavelength conversion pattern WCP1 may include a plurality of first quantum dots dispersed in a matrix material (e.g., a predetermined matrix material) such as base resin. The first quantum dot may absorb blue light and emit red light by shifting a wavelength of the blue light according to energy transition. In one or more embodiments, when the first sub-pixel SPXL1 is a pixel of another color, the first wavelength conversion pattern WCP1 may include a first quantum dot corresponding to the color of the first sub-pixel SPXL1.

In accordance with one or more embodiments, the second wavelength conversion pattern WCP2 may include second color conversion particles for converting light of the third color, which is emitted from the light emitting element LD, into light of a second color. In an example, when the light emitting element LD is a blue light emitting element emitting light of a blue color, and the second sub-pixel SPXL2 is a green pixel, the second wavelength conversion pattern WCP2 may include a second quantum dot for converting light of a blue color, which is emitted from the blue light emitting element, into light of a green color.

For example, the second wavelength conversion pattern WCP2 may include a plurality of second quantum dots dispersed in a matrix material (e.g., a predetermined matrix material) such as base resin. The second quantum dot may absorb blue light and emit green light by shifting a wavelength of the blue light according to energy transition. In one or more embodiments, when the second sub-pixel SPXL2 is a pixel of another color, the second wavelength conversion pattern WCP2 may include a second quantum dot corresponding to the color of the second sub-pixel SPXL2.

In one or more embodiments, the first quantum dot and the second quantum dot may have shape such as a spherical shape, a pyramid shape, a multi-arm shape, a cubic nano particle, a nano wire, a nano fabric, or a nano plate particle. However, the present disclosure is not necessarily limited thereto, and the shape of the first quantum dot and the second quantum dot may be variously changed in a suitable manner.

In one or more embodiments, light of a blue color having a relatively short wavelength in a visible light band is incident into the first quantum dot and the second quantum dot so that absorption coefficients of the first quantum dot and the second quantum dot can be increased. Accordingly, the efficiency of light finally emitted from the first sub-pixel SPXL1 and the second sub-pixel SPXL2 can be improved, and excellent or suitable color reproduction can be ensured. In one or more embodiments, the pixel unit of the first to third sub-pixels SPXL1, SPXL2, and SPXL3 is configured by using light emitting elements LD of the same color (e.g., blue light emitting elements) so that the manufacturing efficiency of the display device can be improved.

In accordance with one or more embodiments, the light transmission pattern LTP may be provided to efficiently use light of the third color emitted from the light emitting element LD. In an example, when the light emitting element LD is a blue light emitting element emitting light of a blue color, and the third sub-pixel SPXL3 is a blue pixel, the light transmission pattern LTP may include at least one kind of light scattering particles to efficiently use light emitted from the light emitting element LD.

For example, the light transmission pattern LTP may include a plurality of light scattering particles dispersed in a matrix material (e.g., a predetermined matrix material) such as base resin. In an example, the light transmission pattern LTP may include light scattering particles such as silica, but the material constituting the light scattering particles is not limited thereto.

In one or more embodiments, the light scattering particles are not to be disposed in only the emission area EMA of the third sub-pixel SPXL3. In an example, the light scattering particles may be selectively included even at the inside of the first wavelength conversion pattern WCP1 and/or the second wavelength conversion pattern WCP2.

The optical layer OPL may include a first capping layer CAP1, a low reflective layer LRL, and a second capping layer CAP2. The optical layer OPL may be disposed on the color conversion layer CCL. The optical layer OPL may be disposed on the display element layer DPL.

The first capping layer CAP1 may seal (or cover) the wave conversion pattern WCP and the light transmission pattern LTP. The first capping layer CAP1 may be disposed between the low refractive layer LRL and the display element layer DPL. The first capping layer CAP1 may be provided throughout the first to third sub-pixels SPXL1, SPXL2, and SPXL3. The first capping layer CAP1 may prevent or substantially prevent the color conversion layer CCL from being damaged or contaminated due to infiltration of an impurity such as moisture or air from the outside.

In accordance with one or more embodiments, the first capping layer CAP1 may be configured as a single layer or a multi-layer including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the present disclosure is not limited thereto.

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided throughout the first to third sub-pixels SPXL1, SPXL2, and SPXL3.

The low refractive layer LRL may function to allow light provided from the color conversion layer CCL to be recycled by total reflection, thereby improving light efficiency. To this end, the low refractive layer LRL may have a refractive index relatively lower than that of the color conversion layer CCL.

In accordance with one or more embodiments, the low refractive layer LRL may include a base resin and hollow particles dispersed in the base resin. The hollow particle may include a hollow silica particle. In one or more embodiments, the hollow particle may be a pore formed by porogen, but the present disclosure is not necessarily limited thereto. Also, the low refractive layer LRL may include one of zinc oxide ($ZnO_x$), a titanium dioxide ($TiO_x$) particle, and a nano silicate particle. However, the present disclosure is not necessarily limited to the above-described example.

The second capping layer CAP2 may be disposed on the low refractive layer LRL. The second capping layer CAP2 may be disposed between the color filter layer CFL and the low refractive layer LRL. The second capping layer CAP2 may be provided throughout the first to third sub-pixels SPXL1, SPXL2, and SPXL3. The second capping layer CAP2 may prevent or substantially prevent the low refractive layer LRL from being damaged or contaminated due to infiltration of an impurity such as moisture or air from the outside.

In accordance with one or more embodiments, the second capping layer CAP2 may be configured as a single layer or a multi-layer including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but the present disclosure is not limited thereto.

The color filter layer CFL may be disposed on the second capping layer CAP2. The color filter layer CFL may be provided throughout the first to third sub-pixels SPXL1, SPXL2, and SPXL3. The color filter layer CFL may include color filters CF1, CF2, and CF3 and a planarization layer PLA.

In accordance with one or more embodiments, the color filters CF1, CF2, and CF3 may be disposed on the second capping layer CAP2. In a plan view, the color filters CF1, CF2, and CF3 may overlap with the emission areas EMA of the first to third sub-pixels SPXL1, SPXL2, and SPXL3.

In accordance with one or more embodiments, a first color filter CF1 allows light of the first color to be transmitted therethrough, and may allow light of the second color and light of the third color not to be transmitted therethrough. For example, the first color filter CF1 may include a colorant of the first color.

In accordance with one or more embodiments, a second color filter CF2 allows light of the second color to be transmitted therethrough, and may allow light of the first color and light of the third color not to be transmitted therethrough. For example, the second color filter CF2 may include a colorant of the second color.

In accordance with one or more embodiments, a third color filter CF3 allows light of the third color to be transmitted therethrough, and may allow light of the first color and light of the second color not to be transmitted therethrough. For example, the third color filter CF3 may include a colorant of the third color.

In accordance with one or more embodiments, the planarization layer PLA may be provided over the color filters CF1, CF2, and CF3. The planarization layer PLA may cover the color filters CF1, CF2, and CF3. The planarization layer PLA may cancel a step difference occurring due to the color filters CF1, CF2, and CF3. The planarization layer PLA may be provided throughout the first to third sub-pixels SPXL1, SPXL2, and SPXL3.

In accordance with one or more embodiments, the planarization layer PLA may include an organic material such as acryl resin, epoxy resin, phenolic resin, polyamides resin, polyimides resin, unsaturated polyesters resin, poly-phenylene ethers resin, poly-phenylene sulfides resin, or benzocyclobutene (BCB). However, the present disclosure is not necessarily limited thereto, and the planarization layer PLA may include various suitable kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The overcoat layer OC may be disposed on the planarization layer PLA. The overcoat layer OC may be disposed between the outer film layer UFL and the color filter layer CFL. The overcoat layer OC may be provided throughout the first to third sub-pixels SPXL1, SPXL2, and SPXL3. The overcoat layer OC may cover a lower member including the color filter layer CFL. The overcoat layer OC may prevent or substantially prevent moisture or air from infiltrating into the above-described lower member. Also, the overcoat layer OC may protect the above-described lower member from a foreign matter such as dust.

In accordance with one or more embodiments, the overcoat layer OC may include an organic material such as acryl resin, epoxy resin, phenolic resin, polyamides resin, polyimides resin, unsaturated polyesters resin, poly-phenylene ethers resin, poly-phenylene sulfides resin, or benzocyclobutene (BCB). However, the present disclosure is not necessarily limited thereto, and the overcoat layer OC may include various suitable kinds of inorganic insulating materials, including silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$).

The outer film layer UFL may be disposed on the color filter layer CFL. The outer film layer UFL may be disposed at an outer portion of the display device DD to reduce external influence on the display device DD. The outer film layer UFL may be provided throughout the first to third sub-pixels SPXL1, SPXL2, and SPXL3.

In accordance with one or more embodiments, the outer film layer UFL may include an anti-reflective (AR) coating. The AR coating may refer to a component formed by coating a material having an anti-reflection function on one surface of a specific component. The coated material may have a low reflectance. In an example, the material used for the AR coating may include one of silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). However, the present disclosure is not limited thereto, and various suitable materials suitable in the art may be applied.

The structure of the pixel PXL is not necessarily limited to the above-described example. For example, in one or more embodiments, the color conversion layer CCL may be disposed in or at a layer different from a layer in or at which the display element layer DPL is disposed.

Hereinafter, the display device DD in accordance with one or more embodiments of the present disclosure will be described based on a reflective structure RS with reference to FIGS. 6 to 22. In FIGS. 6 to 22, descriptions of portions that are the same as or similar to those described above will be simplified or omitted.

First, a display device DD and a reflective structure RS included therein in accordance with a first embodiment of the present disclosure will be described with reference to FIGS. 6 to 14.

Figure 6:
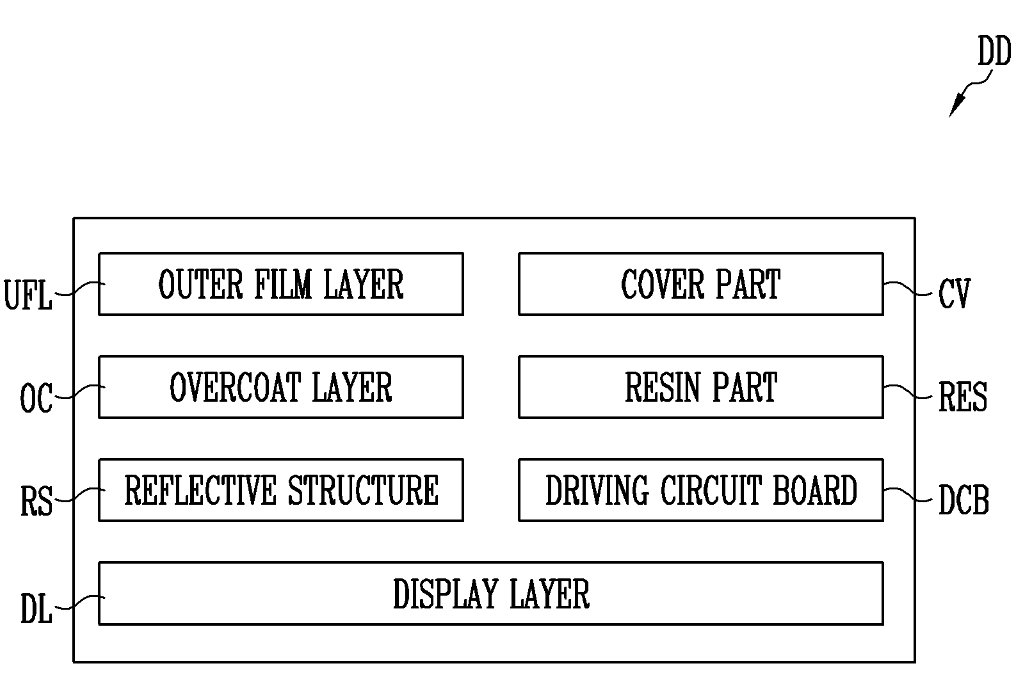
FIG. 6 is a block diagram of a display device in accordance with one or more embodiments of the present disclosure.

FIG. 6 is a block diagram of a display device in accordance with one or more embodiments of the present disclosure.

Figure 7:
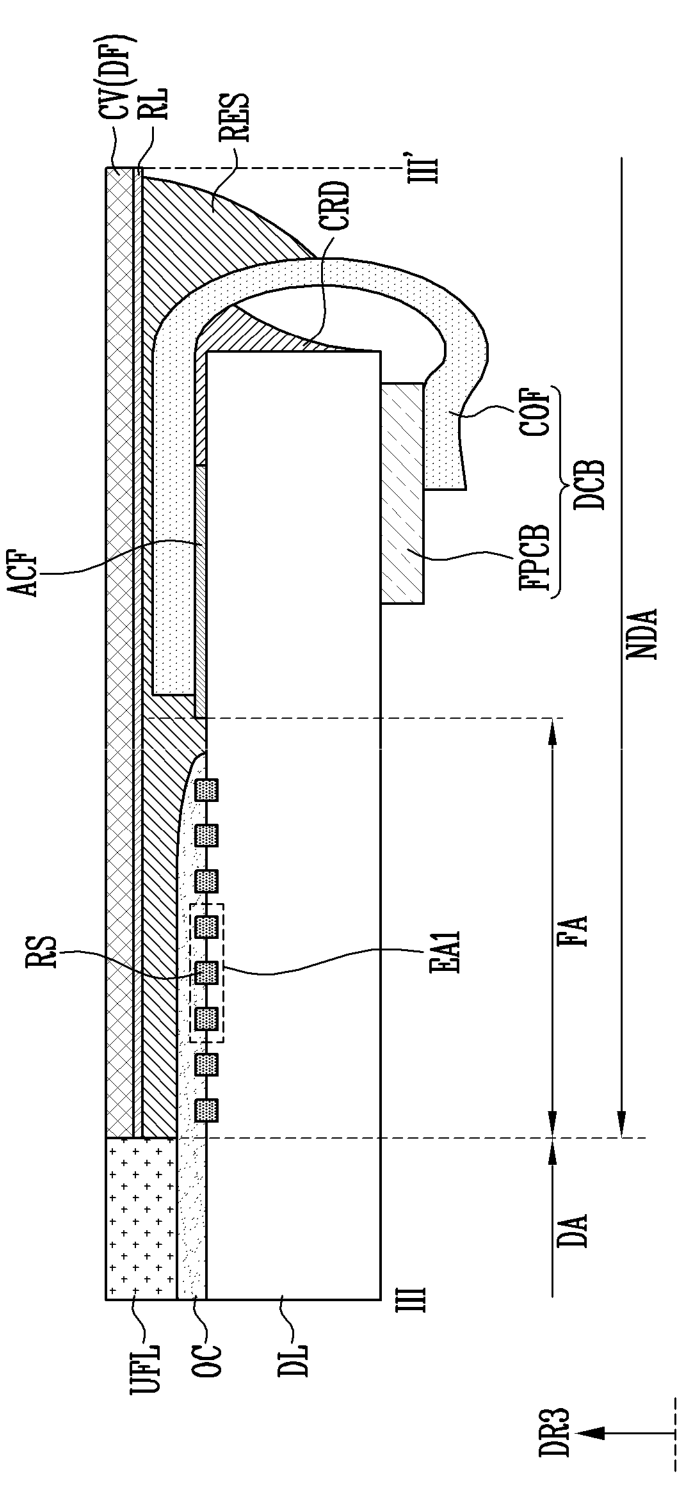
FIGS. 7 and 8 are schematic sectional views illustrating a display device in accordance with a first embodiment of the present disclosure.
Figure 8:
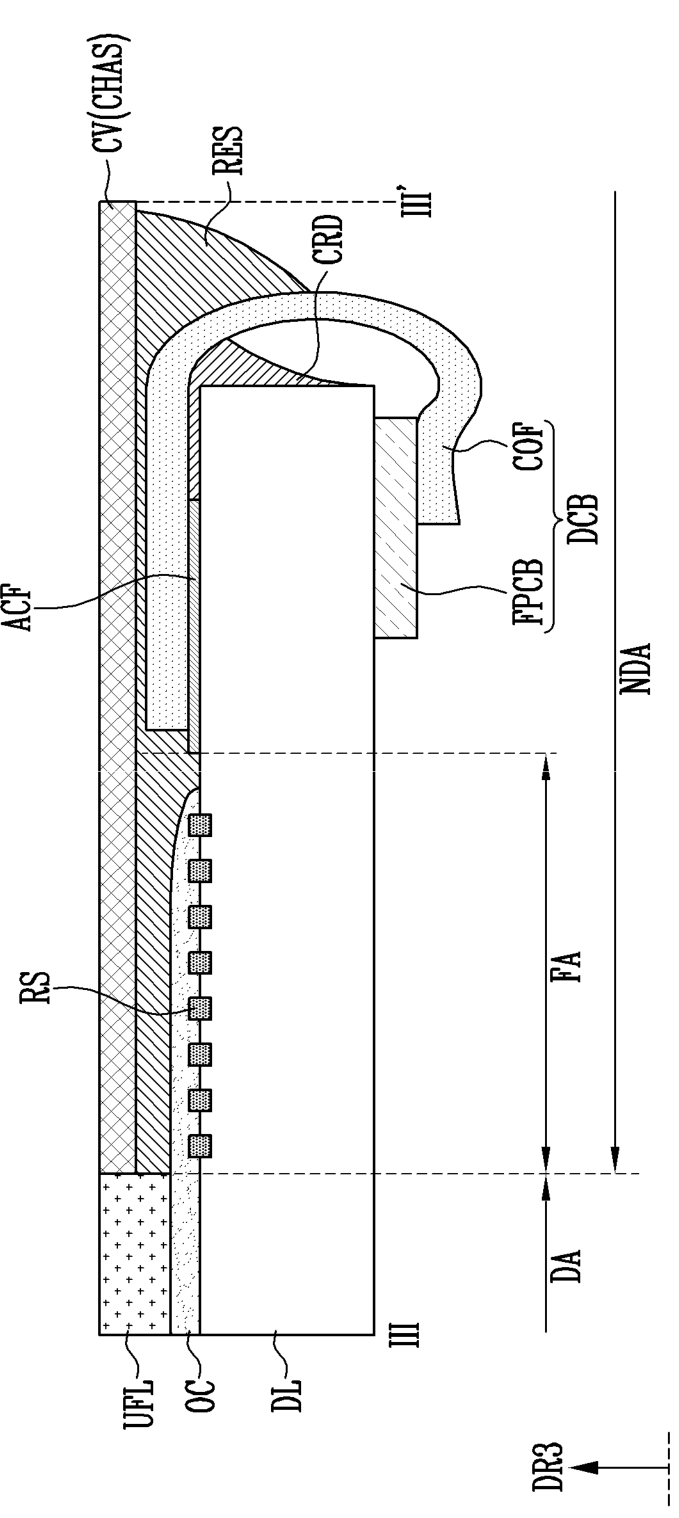

FIGS. 7 and 8 are schematic sectional views illustrating a display device in accordance with a first embodiment of the present disclosure.

FIGS. 9 to 14 are sectional views schematically illustrating a reflective structure included in the display device in accordance with the first embodiment of the present disclosure.

Referring to FIGS. 6 to 8, the display device DD may include a display layer DL, a reflective structure RS, an overcoat layer OC, an outer film layer UFL, a driving circuit board DCB, a resin part RES, and a cover part CV. In one or more embodiments, the display device DD may further include an adhesive layer ACF, an outer resin part CRD, and a reflective layer RL. The driving circuit board DCB may include a chip on film COF and a flexible circuit board FPCB.

The display layer DL may include a display area DA and a non-display area NDA. In one or more embodiments, the display layer DL may include a fan-out area FA. For example, the fan-out area FA may be a portion of the non-display area NDA. The fan-out area FA may be an area between the driving circuit substrate DCB and the display area DA.

A portion of the driving circuit board DCB may be disposed on the display layer DL. For example, a portion of the chip on film COF may be disposed on an area of the display layer DL overlapping with the non-display area NDA. The chip on film COF may be connected to the display layer DL by the adhesive layer ACF. In one or more embodiments, a conductive layer may be disposed adjacent to the adhesive layer ACF. The conductive layer may connect (e.g., electrically connect) a line of the display layer DL and the chip on film COF to each other.

The adhesive layer ACF may couple a portion of the chip on film COF and the display layer DL to each other. In accordance with one or more embodiments, the adhesive layer ACF may include a conductive material, thereby connecting (e.g., electrically connecting) the line of the display layer DL and the chip on film COF to each other. For example, the adhesive layer ACF may be a resin material including a conductive ball. The resin material may be one of epoxy resin and acrylic resin. However, the present disclosure is not necessarily limited to the above-described example. The resin material may include one of various suitable resin materials.

In one or more embodiments, the adhesive layer ACF may be designated as an anisotropic conductive film.

The flexible circuit board FPCB may be connected (or attached) to the display layer DL by the chip on film COF. For example, a portion of the chip on film COF may be bent such that the flexible circuit board FPCB may be disposed on a back surface of the display layer DL.

The overcoat layer OC may be disposed on the display layer DL. The overcoat layer OC may cancel a step difference caused by components disposed in the display layer DL. In one or more embodiments, the overcoat layer OC may be disposed throughout the display area DA and the fan-out area FA. For example, the overcoat layer OC may overlap with the fan-out area FA in a plan view.

The reflective structure RS may include a reflective surface capable of reflecting light. For example, the reflective structure RS may include a reflective surface facing the driving circuit board DCB. Accordingly, the reflective structure RS may be configured to reflect light (e.g., UV light) provided from a side at which the driving circuit board DCB is disposed.

The reflective structure RS may be disposed adjacent to the chip on film COF. For example, the reflective structure RS may be disposed in the fan-out area FA. The reflective structure RS may overlap with the fan-out area FA in a plan view.

However, the position of the reflective structure RS is not necessarily limited to the above-described example. In one or more embodiments, the reflective structure RS may be disposed in the display area DA. Alternatively, in one or more embodiments, the reflective structure RS may be disposed throughout the display area DA and the fan-out area FA.

The reflective structure RS may be disposed between the display area DA and the chip on film COF. The reflective structure RS may be configured to reflect light. For example, the reflective structure RS may reflect UV light.

The reflective structure RS may overlap with the resin part RES in a plan view. For example, the reflective structure RS may overlap with a portion of the resin part RES, which is disposed in the fan-out area FA, in a plan view. The reflective structure RS may overlap with the overcoat layer OC, the resin part RES, and the cover part CV in a plan view. In one or more embodiments, the reflective structure RS may not overlap with the chip on film COF in a plan view. For example, the reflective structure may not overlap with a portion of the driving circuit board DCB, which is disposed on the display layer DL, in a plan view.

The reflective structure RS may be provided in plurality. The number of reflective structures RS is not limited to a specific example.

The outer film layer UFL may be disposed on the overcoat layer OC. The outer film layer UFL may be disposed at an outer surface of the display panel DP (or a layer adjacent to the outer surface), to protect individual components of the display panel DP. In accordance with one or more embodiments, the outer film layer UFL may overlap with the display area DA in a plan view.

The resin part RES may be disposed at an outer portion of the display panel DP. The resin part RES may cover the overcoat layer OC and the chip on film COF. The resin part RES may cover a side surface of the display panel DP.

The resin part RES may not be disposed in the display area DA. The resin part RES may be disposed in the non-display area NDA. For example, a portion of the resin part RES may overlap with the fan-out area FA in a plan view.

The resin part RES may not overlap with the outer film layer UFL in a plan view.

The resin part RES may be disposed on the bottom of the cover part CV. The resin part RES may be disposed between the cover part CV and the chip on film COF. The resin part RES may be disposed between the cover part CV and the overcoat layer OC.

The resin part RES may be adjacent to the reflective structure RS. The resin part RES may overlap with the reflective structure RS in a plan view.

The resin part RES may include a resin. For example, the resin part RES may include a general organic compound. The resin part RES may include one of epoxy resin and acrylic resin. However, the present disclosure is not necessarily limited to the above-described example. In one or more embodiments, the resin part RES may include various suitable resins for forming a polymer or a film.

The resin part RES may be provided at one side of the display panel DP. For example, the resin part RES may be disposed at one side of the display device DD, at which the chip on film COF and the flexible circuit board FPCB are disposed, to reduce influence of dust and moisture on the display device DD.

The cover part CV may be disposed in the non-display area NDA. The cover part CV may overlap with the driving circuit board DCB in a plan view.

The cover part CV may be disposed at one side of the display panel DP. For example, the display device DD may include a plurality of sides, and the cover part CV may be disposed adjacent to one of the plurality of sides. The cover part CV may be disposed adjacent to a side at which the driving circuit board DCB is disposed.

The cover part CV may have a shape extending in one direction. In one or more embodiments, the cover part CV may have a shape including a bending area in which at least a portion of the cover part CV is bent one or more times.

The cover part CV may be disposed at one side of the display panel DP, to allow components adjacent to an outer portion not to be observed from the outside, thereby improving aesthetic impression of the display device DD.

The reflective layer RL may be disposed on a back surface of the cover part CV. The reflective layer RL may be disposed between the resin part RES and the cover part CV. The reflective layer RL may include a reflective material to reflect light. The reflective layer RL may be disposed in the non-display area NDA. For example, the reflective layer RL may overlap with the resin part RES in the non-display area NDA in a plan view. In one or more embodiments, the reflective layer RL may not be provided.

In accordance with one or more embodiments, the cover part CV may include an outer layer DF (e.g., see FIG. 7). In accordance with one or more embodiments, the outer layer DF may be disposed on one surface of the reflective layer RL to prevent or to substantially prevent internal components of the display device DD from being viewed from the outside. In accordance with one or more embodiments, the outer layer DF may include a plurality of layers (e.g., see 1220, 1240, and 1260 shown in FIG. 16). The outer layer DF will be described in more detail later with reference to FIG. 16.

In accordance with another embodiment, the cover part CV may include chassis CHAS. The cover part CV may include a metal. For example, the cover part CV may include an alloy including aluminum (Al) and magnesium (Mg). However, the present disclosure is not necessarily limited to the above-described example.

The outer resin part CRD may be disposed at an outer portion of the display panel DP. A portion of the outer resin part CRD may be disposed on a back surface of the chip on film COF. For example, a portion of the outer resin part CRD may be disposed between the chip on film COF and the display layer DL. The outer resin part CRD may include an organic material. For example, the outer resin part CRD may include one of epoxy resin and acrylic resin. However, the present disclosure is not necessarily limited to the above-described example.

Hereinafter, a sectional structure of the reflective structure RS in accordance with the first embodiment of the present disclosure will be described with reference to FIGS. 9 to 14. FIGS. 9 to 14 may illustrate reflective structures RS in accordance with first to sixth embodiment forms. FIGS. 9 to 13 are enlarged views of area EA1 shown in FIG. 7.

Figure 9:
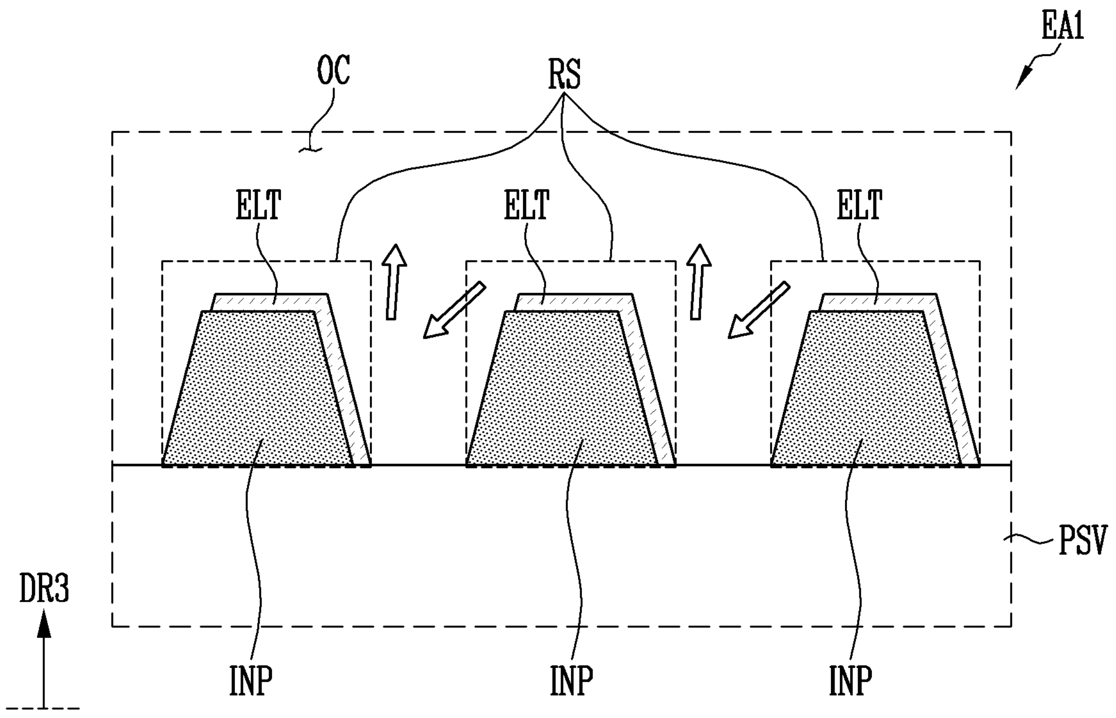
FIGS. 9 to 14 are sectional views schematically illustrating a reflective structure included in the display device in accordance with the first embodiment of the present disclosure.

FIG. 9 may illustrate a reflective structure RS in accordance with a first embodiment form in the first embodiment of the present disclosure. Referring to FIG. 9, the reflective structure RS may be disposed on the protective layer PSV. For example, the reflective structure RS may be disposed on the pixel circuit layer PCL.

The reflective structure RS may include an insulating pattern INP and a reflective electrode ELT. The insulating pattern INP may have a shape protruding in the thickness direction of the substrate SUB (e.g., the third direction DR3). The insulating pattern INP may be provided in plurality to be spaced from each other.

The reflective electrode ELT may be disposed on one surface of the insulating pattern INP to serve as a reflective partition wall. For example, the reflective electrode ELT may be disposed to face a direction in which light (e.g., UV light) is provided. Accordingly, light provided to the reflective electrode ELT may be reflected in a set direction (e.g., a predetermined direction).

Reflective electrodes ELT of adjacent reflective structures RS may be spaced from each other. For example, the reflective electrodes ELT may be disposed on side surfaces of the respective insulating patterns INP.

The reflective electrodes ELT may be patterned through the same process as the first electrode ELT1 and the second electrode ELT2, which are described above with reference to FIG. 3, and include the same material as the first electrode ELT1 and the second electrode ELT2. Also, the insulating pattern INP may be patterned through the same process as the first insulating pattern INP1 and the second insulating pattern INP2, which are described above with reference to FIG. 4. Accordingly, any separate process is not added to form the reflective structure RS, and process cost can be saved.

The reflective structure RS may be covered by the overcoat layer OC. In accordance with one or more embodiments, the overcoat layer OC may be configured to allow light to be transmitted therethrough, and accordingly, light is provided to the reflective structure RS to be reflected by the reflective structure RS. In one or more embodiments, in FIGS. 9 to 14, the overcoat layer OC is not represented as a separate pattern such that the drawing can be clearly illustrated.

Figure 10:
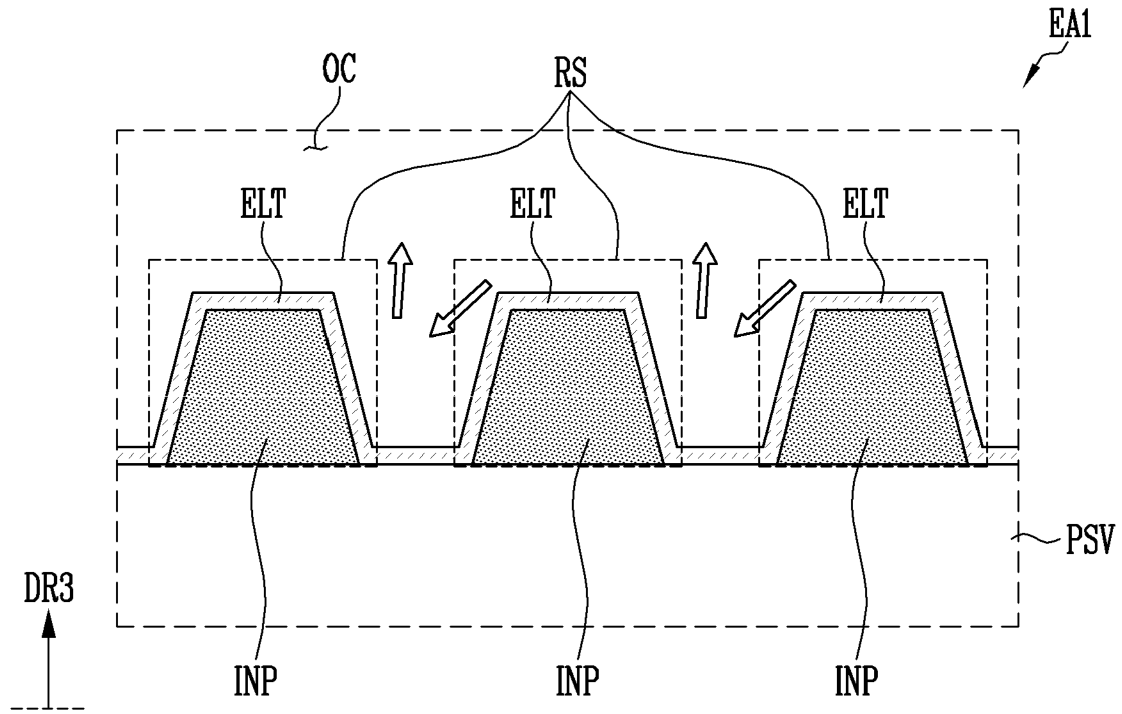

FIG. 10 may illustrate a reflective structure RS in accordance with a second embodiment form in the first embodiment of the present disclosure. As for the reflective structure RS in accordance with the second embodiment form, differences from the reflective structure RS in accordance with the first embodiment form will be primarily described.

Referring to FIG. 10, unlike the reflective structure RS in accordance with the first embodiment form, in the reflective structure RS in accordance with the second embodiment form, reflective electrodes ELT of adjacent reflective structures RS may be connected to each other. For example, the reflective structure RS may include a first reflective structure and a second reflective structure adjacent to the first reflective structure. A reflective electrode ELT of the first reflective structure may be connected to a reflective electrode ELT of the second reflective structure.

For example, because any separate electrical signal for driving is not provided to the reflective electrodes ELT of the reflective structure RS, it is possible that the reflective electrodes ELT of the reflective structure RS are connected (e.g., electrically connected) to each other.

Figure 11:
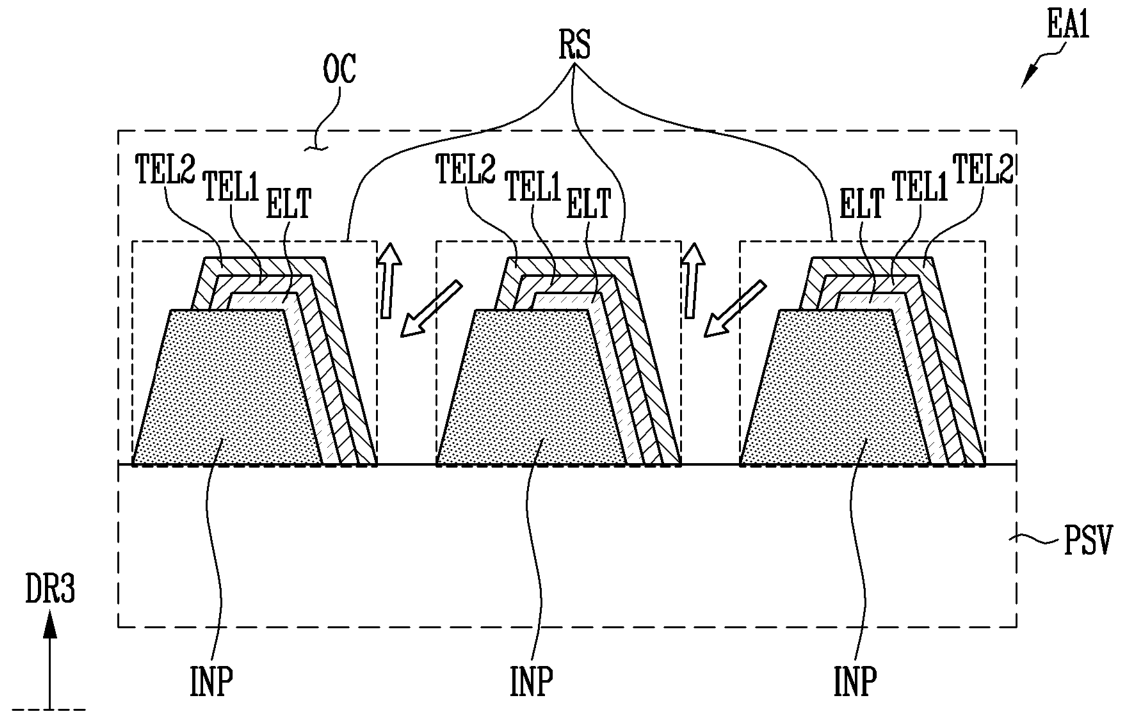

FIG. 11 may illustrate a reflective structure RS in accordance with a third embodiment form in the first embodiment of the present disclosure. As for the reflective structure RS in accordance with the third embodiment form, differences from the reflective structure RS in accordance with the first embodiment form will be primarily described.

Referring to FIG. 11, the reflective structure RS may further include a first transparent electrode layer TEL1 and a second transparent electrode layer TEL2. For example, the first transparent electrode layer TEL1 may be disposed over the reflective electrode ELT, and the second transparent electrode layer TEL2 may be disposed over the first transparent electrode layer TEL1. In the third embodiment form, the first transparent electrode layer TEL1 and the second transparent electrode layer TEL2 may be covered by the overcoat layer OC. In accordance with the third embodiment form, each of reflective electrodes ELT are covered by the first transparent electrode layer TEL1 and the second transparent electrode layer TEL2 to be protected from external influence.

In accordance with one or more embodiments, the first transparent electrode layer TEL1 may be patterned with the above-described first contact electrode CNE1 through the same process. The second transparent electrode layer TEL2 may be patterned with the above-described second contact electrode CNE2 through the same process. Accordingly, because an additional process phase is not added, the reflective electrode ELT can be protected from external influence, and process cost can be saved.

Figure 12:
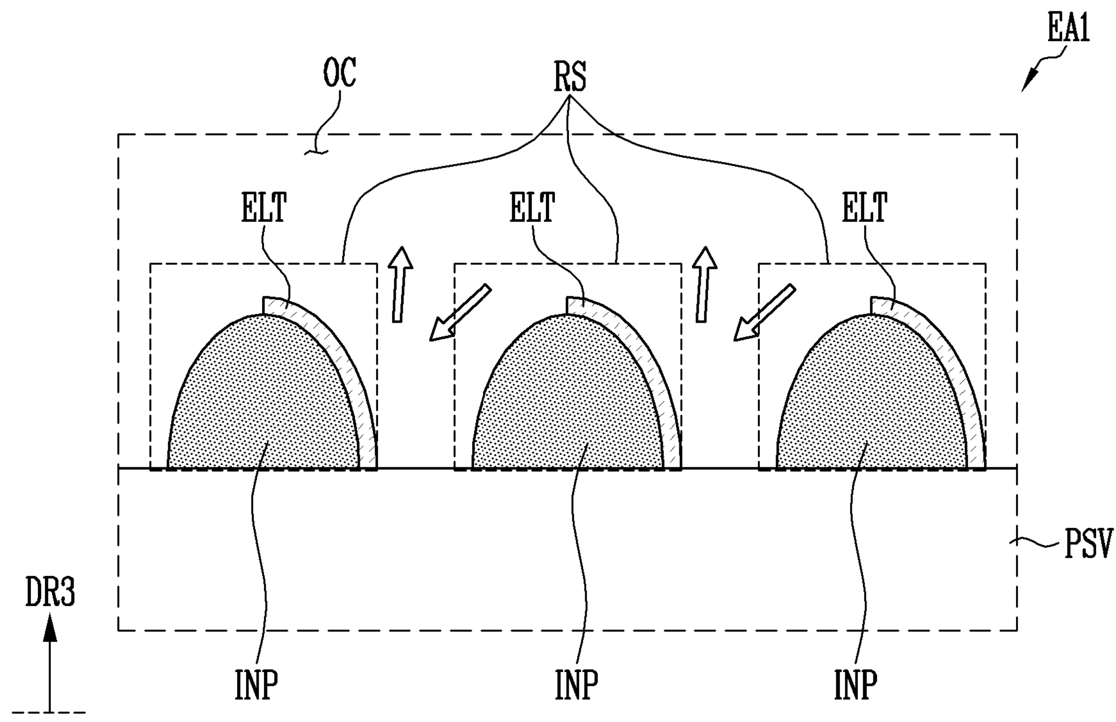

FIG. 12 may illustrate a reflective structure RS in accordance with a fourth embodiment form in the first embodiment of the present disclosure. As for the reflective structure RS in accordance with the fourth embodiment form, differences from the reflective structure RS in accordance with the first embodiment form will be primarily described.

Referring to FIG. 12, the reflective structure RS may have a shape including a curved surface. For example, an insulating pattern INP may include an outer surface having a curved shape while having a shape roughly protruding in the third direction DR3. In one or more embodiments, a reflective electrode ELT may be disposed on one surface of the insulating pattern INP to have a shape corresponding to the outer surface of the insulating pattern INP.

Figure 13:
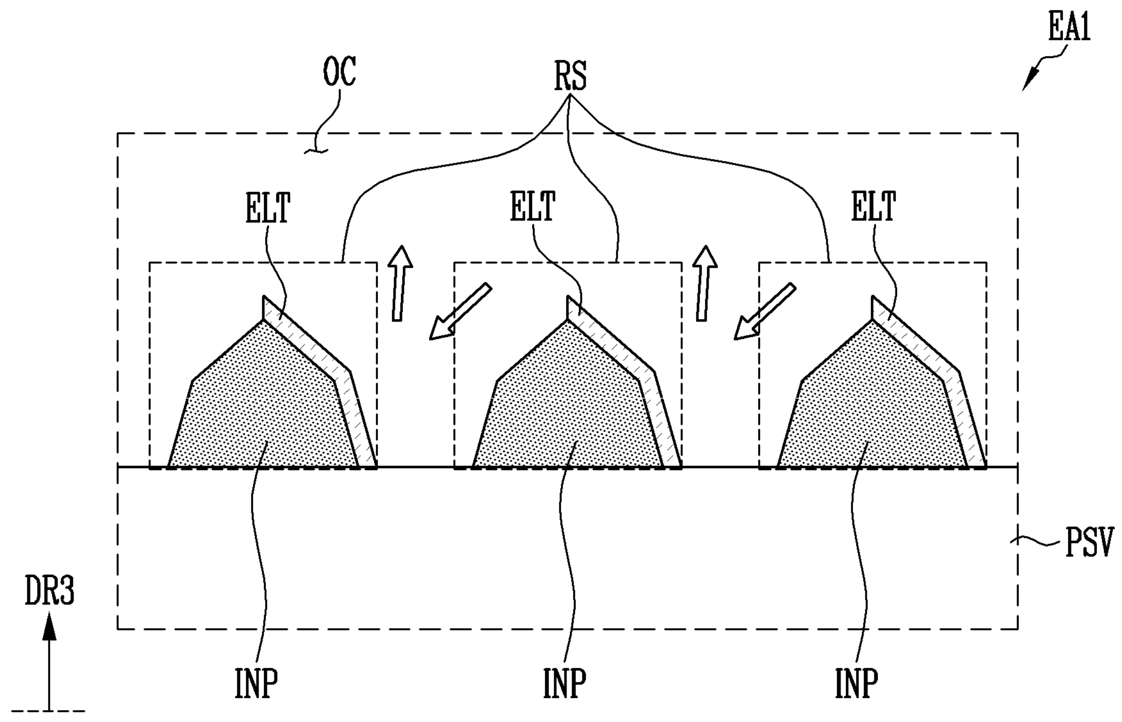

FIG. 13 may illustrate a reflective structure RS in accordance with a fifth embodiment form in the first embodiment of the present disclosure. As for the reflective structure RS in accordance with the fifth embodiment form, differences from the reflective structure RS in accordance with the first embodiment form will be primarily described.

Referring to FIG. 13, the reflective structure RS may have a polygonal shape (e.g., a predetermined polygonal shape). For example, an insulating pattern INP may include an outer surface having a polygonal shape while having a shape roughly protruding in the third direction DR3. In one or more embodiments, a reflective electrode ELT may be disposed on one surface of the insulating pattern INP to have a shape corresponding to the outer surface of the insulating pattern INP. In one or more embodiments, although a case where the reflective structure RS has a pentagonal shape is illustrated in FIG. 13, the present disclosure is not limited thereto. For example, the reflective structure RS may have a triangular shape, and have n-polygonal shape (n is an integer greater than 6).

Figure 14:
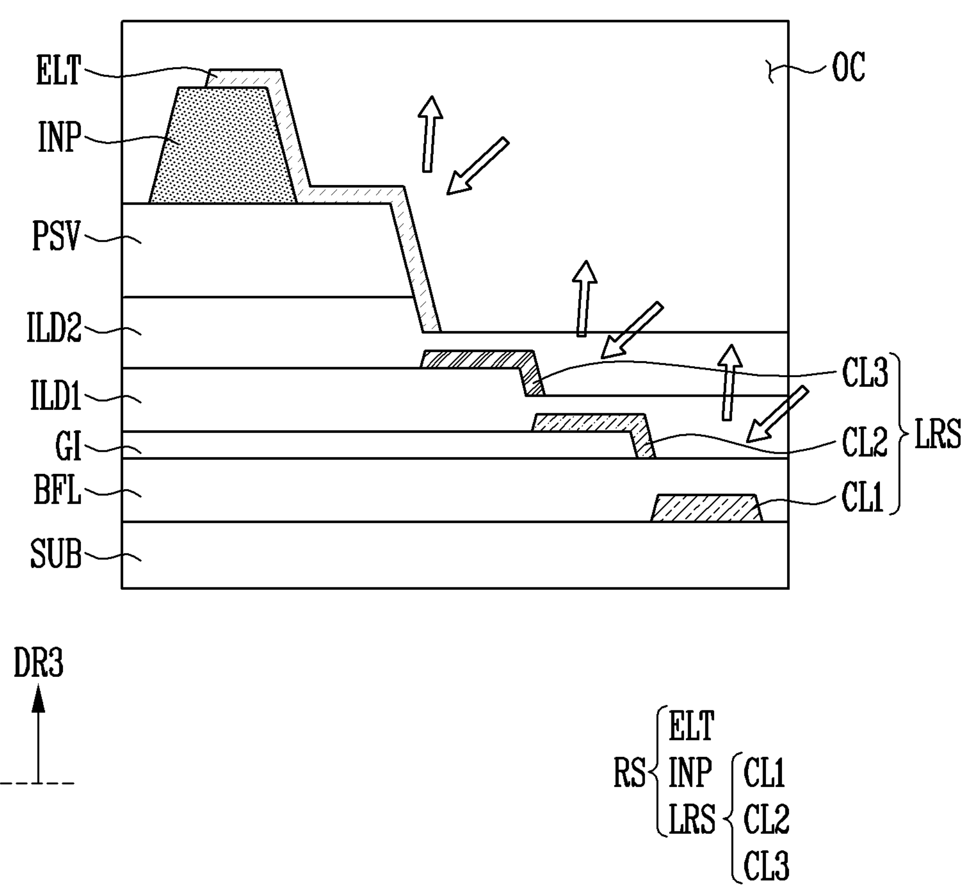

FIG. 14 may illustrate a reflective structure RS in accordance with a sixth embodiment form in the first embodiment of the present disclosure. As for the reflective structure RS in accordance with the sixth embodiment form, differences from the reflective structure RS in accordance with the first embodiment form will be primarily described.

Referring to FIG. 14, the reflective structure RS may further include a lower reflective structure LRS. The lower reflective structure LRS may include reflective layers CL1, CL2, and CL3 disposed in the pixel circuit layer PCL. For example, the lower reflective structure LRS may include a first reflective layer CL1, a second reflective layer CL2, and a third reflective layer CL3.

The lower reflective structure LRS may be configured to reflect light (e.g., UV light) while being disposed closer to the substrate SUB than the reflective structure RS (e.g., a component of the reflective structure RS other than the lower reflective structure LRS) disposed on the protective layer PSV is to the substrate SUB. For example, at least a portion of the lower reflective structure LRS may be disposed to face a path through which light is provided. For example, the provided light may be provided from a side of the driving circuit board DCB. The provided light may be reflected toward the driving circuit board DCB by the lower reflective structure LRS.

The first reflective layer CL1 may be disposed on the substrate SUB, and be covered by the buffer layer BFL. The first reflective layer CL1 may be disposed in the same layer as the auxiliary electrode layer BML. The first reflective layer CL1 may be patterned with the auxiliary electrode layer BML through the same process, and include the same material as the auxiliary electrode layer BML.

The second reflective layer CL2 may be disposed on the gate insulating layer GI, and be covered by the first interlayer insulating layer ILD1. The second reflective layer CL2 may be disposed on a sidewall defined by the gate insulating layer GI. For example, the second reflective layer CL2 may contact a sidewall of the gate insulating layer GI. The second reflective layer CL2 may be patterned with the gate electrode GE, and include the same material as the gate electrode GE.

The third reflective layer CL3 may be disposed on the first interlayer insulating layer ILD1, and be covered by the second interlayer insulating layer ILD2. The third reflective layer CL3 may be disposed on a sidewall defined by the first interlayer insulating layer ILD1. For example, the third reflective layer CL3 may contact a sidewall of the first interlayer insulating layer ILD1. The third reflective layer CL3 may be patterned with the first transistor electrode TE1 and the second transistor electrode TE2 through the same process, and include the same material as the first transistor electrode TE1 and the second transistor electrode TE2.

In accordance with one or more embodiments, a portion of a reflective electrode ELT may be disposed on a sidewall defined by the protective layer PSV and the second interlayer insulating layer ILD2. For example, a portion of a reflective electrode ELT may contact a sidewall of the protective layer PSV and the second interlayer insulating layer ILD2. Similarly, the portion of the reflective electrode ELT, which is disposed on the sidewall, may be disposed while facing a path of light to reflect light.

In accordance with the sixth embodiment form, an additional reflective structure is formed in a layer corresponding to the pixel circuit layer PCL so that the reflection efficiency of provided light can be further improved.

Next, a display device DD and a reflective structure RS included therein in accordance with a second embodiment of the present disclosure will be described with reference to FIGS. 6 and 15 to 22. In FIS. 6 and 15 to 22, descriptions of portions that are the same as or similar to those described above will be simplified or omitted.

Figure 15:
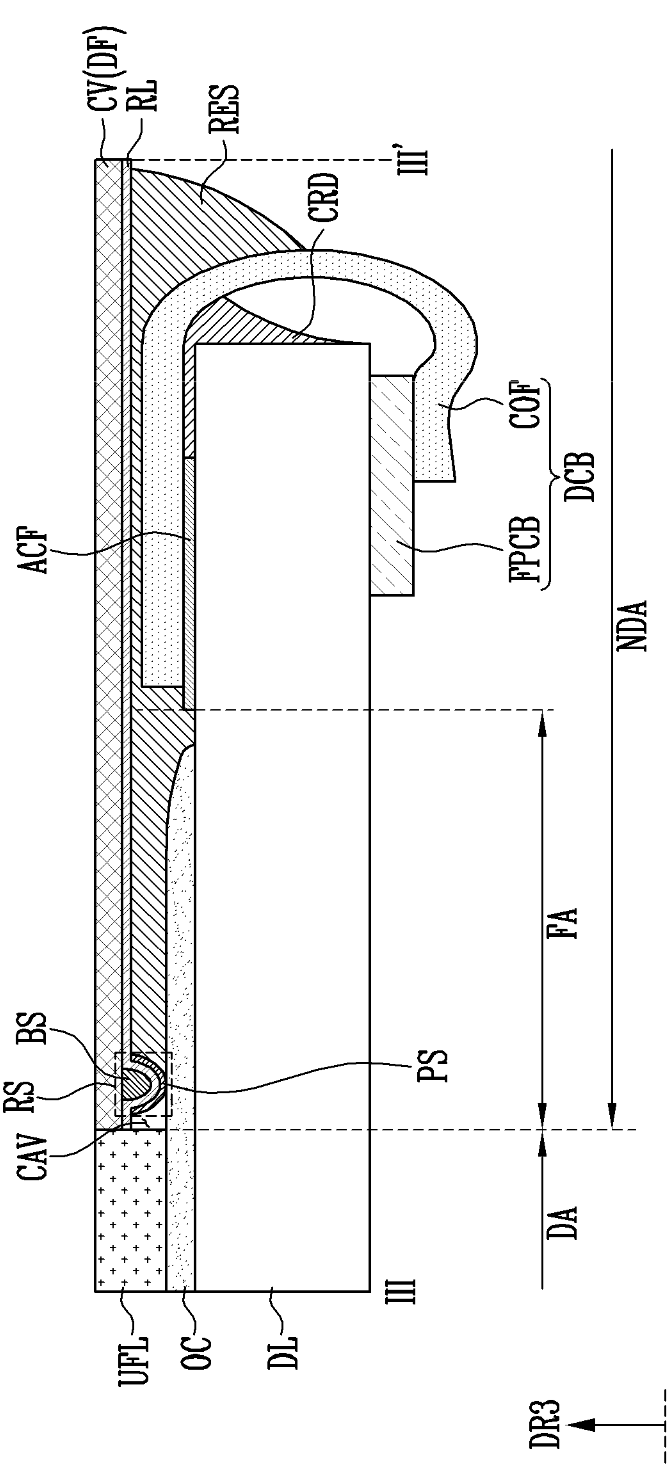
FIG. 15 is a schematic sectional view illustrating a display device in accordance with a second embodiment of the present disclosure.

FIG. 15 is a schematic sectional view illustrating a display device in accordance with a second embodiment of the present disclosure.

FIGS. 16 to 22 are sectional views schematically illustrating a reflective structure included in the display device in accordance with the second embodiment of the present disclosure.

The display device DD in accordance with the second embodiment of the present disclosure is different from the display device DD in accordance with the first embodiment of the present disclosure, in that a reflective structure RS is disposed to protrude on the cover part CV.

In FIG. 15, for convenience of description, an embodiment in which the cover part CV includes the outer layer DF is mainly illustrated. However, the cover part CV may include the chassis CHAS in one or more embodiments.

Referring to FIG. 15, the reflective structure RS may be disposed on one surface of the cover part CV. For example, the reflective structure RS may be disposed on one surface of the reflective layer RL. The reflective structure RS may have a shape protruding in the thickness direction of the substrate SUB (e.g., the third direction DR3.

The reflective structure RS may be disposed in the non-display area NDA. For example, the reflective structure RS may overlap with the fan-out area FA in a plan view.

The reflective structure RS may be disposed between the cover part CV and the overcoat layer OC. A base surface BS of the reflective structure RS may face the overcoat layer OC. For example, the base surface BS (e.g., a lower surface having a wide area) of the reflective structure RS may be in contact with the cover part CV. A protrusion surface PS of the reflective structure RS may be in contact with the overcoat layer OC.

A cavity CAV may be formed at one side of the reflective structure RS. The cavity CAV may be disposed between the outer film layer UFL and the reflective structure RS. The reflective structure RS may separate (e.g., fluidly separate) the cavity CAV and the resin part RES from each other. In accordance with one or more embodiments, the reflective structure RS may prevent or substantially prevent the resin part RES from being leaked to the cavity CAV.

A detailed structure of the reflective structure RS will be described with reference to FIGS. 16 to 22. Moreover, a detailed structure of the outer layer DF as an embodiment of the cover part CV will be described with reference to FIG. 16.

Figure 16:
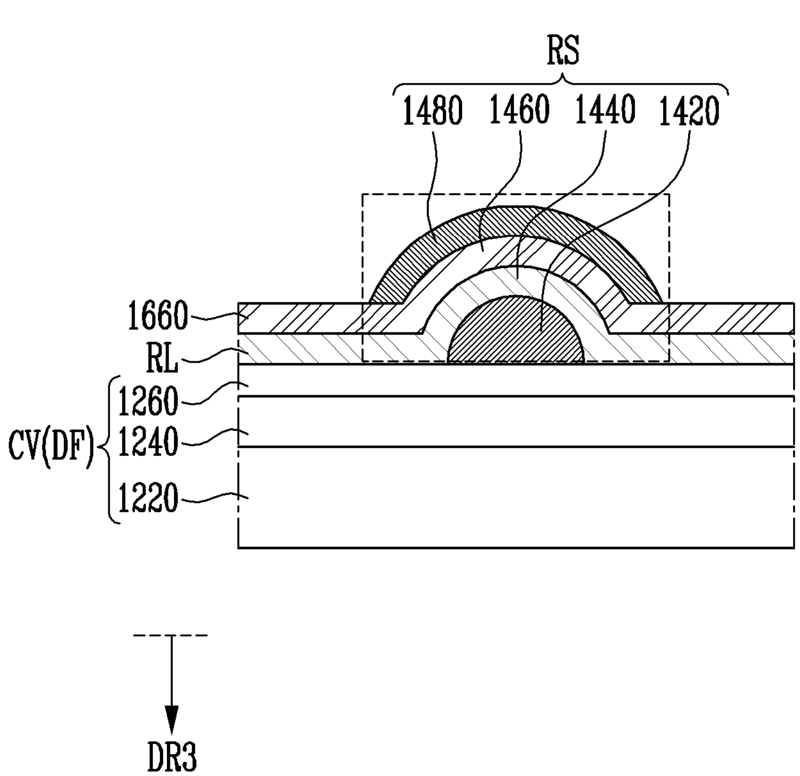
FIGS. 16 to 22 are sectional views schematically illustrating a reflective structure included in the display device in accordance with the second embodiment of the present disclosure.

FIG. 16 may illustrate a structure of a reflective structure RS in accordance with a first embodiment form, which is included in the display device DD in accordance with the second embodiment of the present disclosure.

Referring to FIG. 16, the outer layer DF may include a first outer layer 1220, a second outer layer 1240, and a third outer layer 1260.

The first outer layer 1220 may be disposed on one surface of the second outer layer 1240. The first outer layer 1220 may be disposed at an outermost portion of the outer layer DF. For example, the first outer layer 1220 may be disposed adjacent to an outer surface of the display device DD.

The first outer layer 1220 may protect components of the display device DD from external influence. In accordance with one or more embodiments, the first outer layer 1220 may include a polymer material. For example, the first outer layer 1220 may include polyethylene terephthalate (PET). However, the present disclosure is not necessarily limited to the above-described example.

The second outer layer 1240 may be disposed between the first outer layer 1220 and the third outer layer 1260. One surface of the second outer layer 1240 may be in contact with the first outer layer 1220, and the other surface of the second outer layer 1240 may be in contact with the third outer layer 1260.

The second outer layer 1240 may allow components of the display device DD not to be viewed from the outside. In accordance with one or more embodiments, the second outer layer 1240 may allow light not to be transmitted therethrough. For example, the second outer layer 1240 may include a light blocking or light absorbing material. The second outer layer 1240 may include a black matrix.

The third outer layer 1260 may be disposed on the other surface (e.g., a surface other than the surface in contact with the first outer layer 1220) of the second outer layer 1240. The third outer layer 1260 may be disposed adjacent to the reflective structure RS. For example, one surface of the third outer layer 1260 may be in contact with a portion (e.g., a cushion layer 1420) of the reflective structure RS.

The third outer layer 1260 may include an inorganic material. For example, the third outer layer 1260 may include one of silicon nitride ($SiN_x$), silicon oxide ($SiO_x$), silicon oxynitride ($SiO_xN_y$), and aluminum oxide ($AlO_x$). However, the present disclosure is not necessarily limited to the above-described example.

The reflective layer RL may be disposed on the outer layer DF. One surface of the reflective layer RL may be in contact with the third outer layer 1260. The reflective layer RL may include a reflective material. A portion of the reflective layer RL may be disposed on the cushion layer 1420 to be provided to a reflective film 1440.

An insulating layer 1660 may be disposed on the reflective layer RL. One surface of the insulating layer 1660 may be in contact with the reflective layer RL. In accordance with one or more embodiments, the insulating layer 1660 may include an inorganic material. For example, the insulating layer 1660 may include one of silicon nitride ($SiN_x$), silicon oxide ($SiO_x$), silicon oxynitride ($SiO_xN_y$), and aluminum oxide ($AlO_x$). However, the present disclosure is not necessarily limited to the above-described example.

The reflective structure RS may be disposed on the outer layer DF. For example, the reflective structure RS may be adjacent to the third outer layer 1260. The reflective structure may be in contact with the third outer layer 1260 of the outer layer DF.

The reflective structure RS may include the cushion layer 1420, the reflective film 1440, an insulating film 1460 and an adhesive film (e.g., an adhesive layer) 1480.

The cushion layer 1420 may be disposed on the outer layer DF. One surface of the cushion layer 1420 may be in contact with the third outer layer 1260.

The cushion layer 1420 may have a shape protruding in a thickness direction of the outer layer DF. The cushion layer 1420 has a shape protruding in one direction so that the reflective layer RL disposed on the cushion layer 1420 can be configured as a reflective partition wall.

The cushion layer 1420 may have (e.g., entirely have) an elliptical shape. One surface of the cushion layer 1420 may have a curved shape. In accordance with one or more embodiments, the cushion layer 1420 may have a hemispherical shape. However, the present disclosure is not necessarily limited to the above-described example.

The cushion layer 1420 may have an elastic property. For example, the cushion layer 1420 may include an elastic material. In accordance with one or more embodiments, the cushion layer 1420 may include high-elastic polymer. For example, the cushion layer 1420 may include one of urethane resin and acrylic resin, but the present disclosure is not limited thereto. The cushion layer 1420 may include various suitable polymers having the elastic property.

In accordance with one or more embodiments, the cushion layer 1420 has the elastic property so that a distance between the outer layer DF and the overcoat layer OC can be controlled (e.g., thoroughly controlled). In one or more embodiments, a step difference occurring due to the overcoat layer OC is compensated so that the position of the outer layer DF can be controlled (e.g., precisely controlled).

The reflective film 1440 may include a partial area of the reflective layer RL. The reflective film 1440 may be disposed over the cushion layer 1420. The reflective film 1440 capable of reflecting light may be disposed on one surface of the cushion layer 1420 to reflect light. A shape of the reflective film 1440 may correspond to a shape of an outer surface of the cushion layer 1420.

The insulating film 1460 may include a partial area of the insulating layer 1660. The insulating film 1460 may be disposed over the reflective film 1440. The insulating film 1460 may cover the reflective film 1440, thereby protecting the reflective film 1440 from external influence. A shape of the insulating film 1460 may correspond to a shape of an outer surface of the reflective film 1440.

The adhesive film 1480 may be disposed on the insulating film 1460. A shape of the adhesive film 1480 may correspond to a shape of an outer surface of the insulating film 1460. The adhesive film 1480 may overlap with the cushion layer 1420 in a plan view.

The adhesive film 1480 may have an adhesive property. The adhesive film 1480 may couple the reflective structure RS to the overcoat layer OC. The adhesive film 1480 may be in contact with the overcoat layer OC.

The adhesive film 1480 may have a light transmission property. The adhesive film 1480 may allow UV light to be transmitted therethrough. In accordance with one or more embodiments, the adhesive film 1480 may include an Optically Clear Adhesive (OCA) or a light transmissive tape. However, the present disclosure is not necessarily limited to the above-described example.

In accordance with one or more embodiments, the adhesive film 1480 has the light transmission property so that the reflective film 1440 can sufficiently reflect light.

In accordance with one or more embodiments, the adhesive film 1480 may couple the reflective structure RS and the overcoat layer OC to each other, thereby preventing or substantially preventing resin from being leaked to an inadequate position (e.g., the cavity CAV) when the resin part RES is formed.

Figure 17:
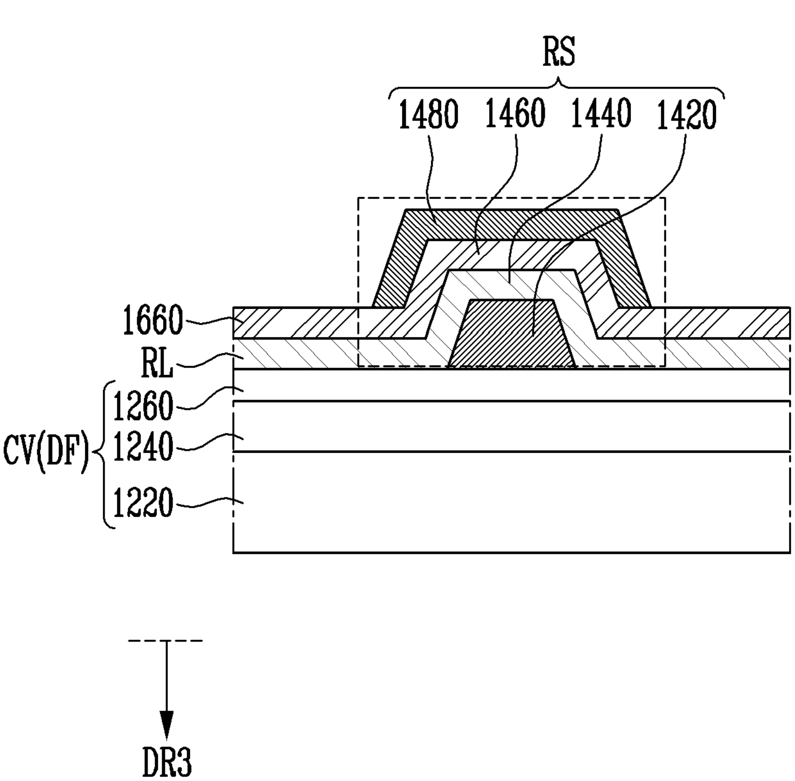

FIG. 17 may illustrate a reflective structure RS in accordance with a second embodiment form, which is included in the display device DD in accordance with the second embodiment of the present disclosure. As for the reflective structure RS in accordance with the second embodiment form, differences from the reflective structure RS in accordance with the first embodiment form will be primarily described.

Referring to FIG. 17, unlike the reflective structure RS in accordance with the first embodiment form, in the reflective structure RS in accordance with the second embodiment form, the cushion layer 1420 may have a polygonal shape. Accordingly, the reflective film 1440, the insulating film 1460, and the adhesive film 1480, which are disposed over the cushion layer 1420, may have a polygonal shape corresponding to a shape of an outer surface of the cushion layer 1420.

Figure 18:
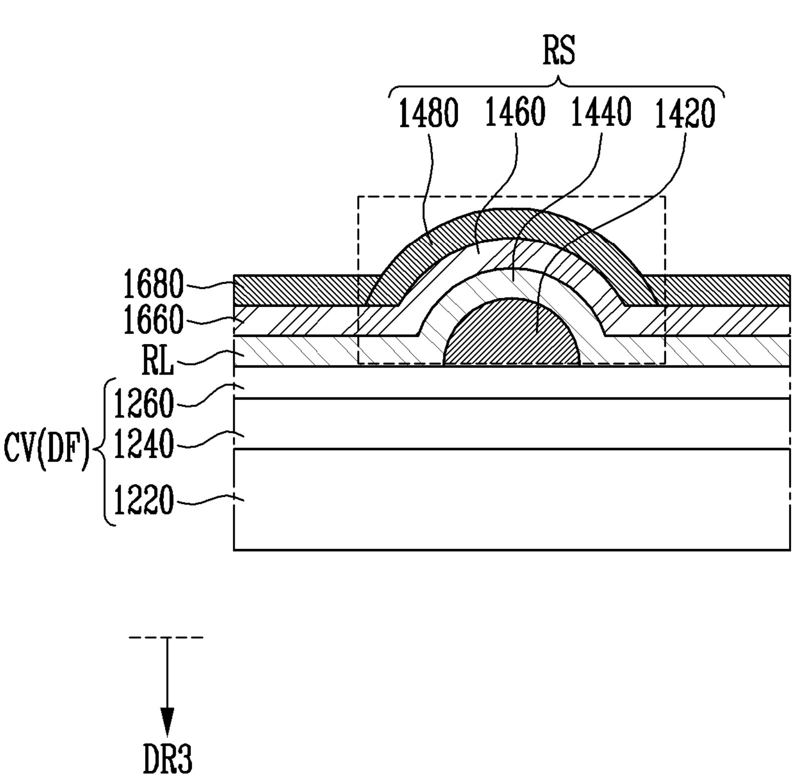

FIG. 18 may illustrate a reflective structure RS in accordance with a third embodiment form, which is included in the display device DD in accordance with the second embodiment of the present disclosure. As for the reflective structure RS in accordance with the third embodiment form, differences from the reflective structure RS in accordance with the first embodiment form will be primarily described.

Referring to FIG. 18, unlike the reflective structure RS in accordance with the first embodiment form, in the reflective structure RS in accordance with the third embodiment form, the adhesive film 1680 may be disposed even on the insulating layer 1660. For example, the adhesive film 1680 having an adhesive property and a light transmission property may be entirely disposed on the insulating layer 1660. The adhesive film 1680 is disposed between the resin part RES and the outer layer DF (or the reflective layer RL) so that coupling between the resin part RES and the outer layer DF can be solidified.

Figure 19:
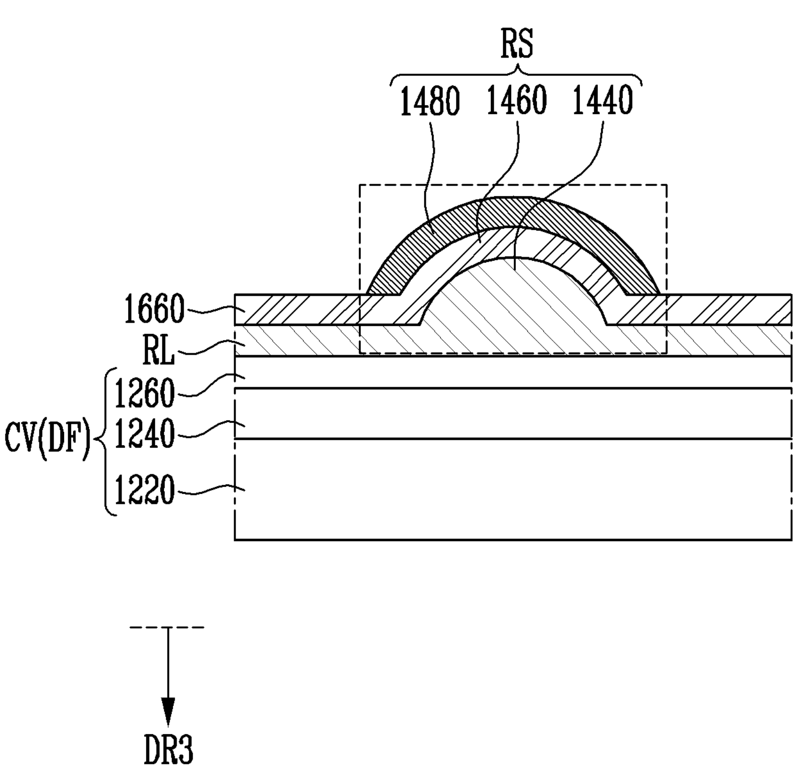

FIG. 19 may illustrate a reflective structure RS in accordance with a fourth embodiment form, which is included in the display device DD in accordance with the second embodiment of the present disclosure. As for the reflective structure RS in accordance with the fourth embodiment form, differences from the reflective structure RS in accordance with the first embodiment form will be primarily described.

Referring to FIG. 19, unlike the reflective structure RS in accordance with the first embodiment form, in the reflective structure RS in accordance with the fourth embodiment form, the cushion layer 1420 is not disposed, and the reflective film 1440 may have a shape protruding in the thickness direction of the substrate SUB (e.g., the third direction DR3). For example, the reflective film 1440 at a position at which the reflective structure RS is to be disposed may have a shape protruding in one direction, and an outer surface of the reflective film 1440 may also be configured to reflect light. In accordance with one or more embodiments, the outer surface of the reflective film 1440 may entirely have a curved shape, but the present disclosure is not limited thereto.

Figure 20:
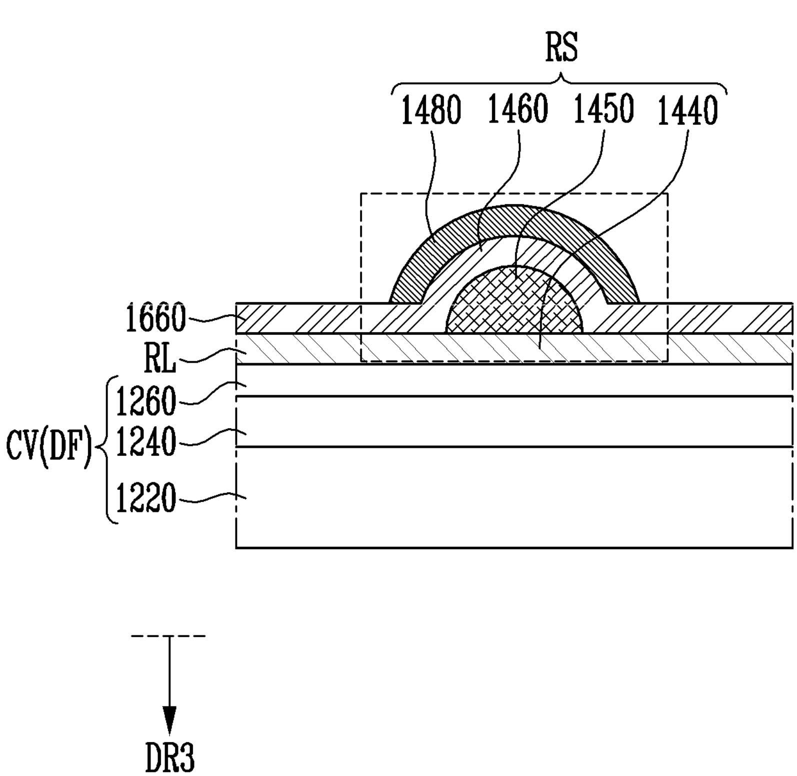

FIG. 20 may illustrate a reflective structure RS in accordance with a fifth embodiment form, which is included in the display device DD in accordance with the second embodiment of the present disclosure. As for the reflective structure RS in accordance with the fifth embodiment form, differences from the reflective structure RS in accordance with the first embodiment form will be primarily described.

Referring to FIG. 20, unlike the reflective structure RS in accordance with the first embodiment form, in the reflective structure RS in accordance with the fifth embodiment form, the cushion layer 1420 is not disposed, and an ink structure 1450 may be further included. The reflective film 1440 is not disposed over any protrusion structure, and may be disposed on the outer layer DF. For example, the reflective film 1440 may contact the outer layer DF. The ink structure 1450 may have a shape protruding in the thickness direction of the substrate SUB. In accordance with one or more embodiments, the ink structure 1450 may include an ink including silver (Ag). An outer surface of the ink structure 1450 may entirely have a curved shape. However, the present disclosure is not necessarily limited to the above-described example.

Figure 21:
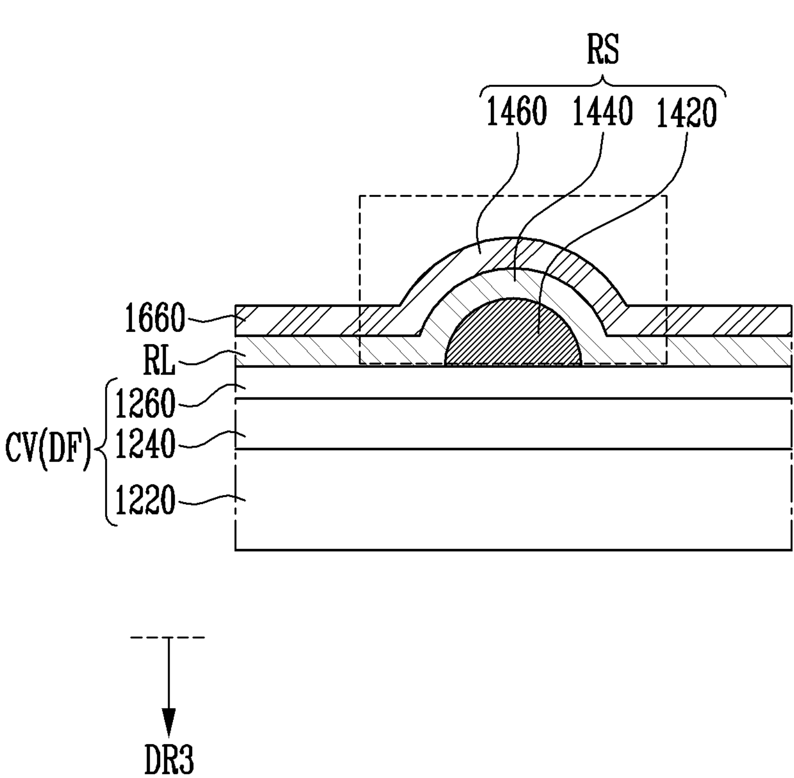
Figure 22:
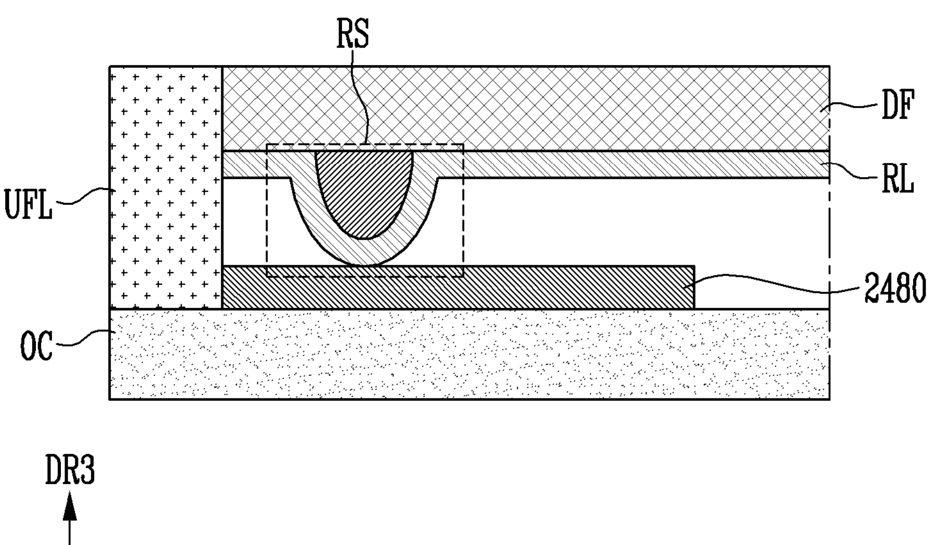

FIG. 21 may illustrate a reflective structure RS in accordance with a sixth embodiment form, which is included in the display device DD in accordance with the second embodiment of the present disclosure. FIG. 22 may illustrate a structure in which the reflective structure RS in accordance with the sixth embodiment form and the overcoat layer OC are connected to each other. As for the reflective structure RS in accordance with the sixth embodiment form, differences from the reflective structure RS in accordance with the first embodiment form will be primarily described.

Referring to FIGS. 21 and 22, unlike the reflective structure RS in accordance with the first embodiment form, the reflective structure RS in accordance with the sixth embodiment form may not include the adhesive film 1480. In FIG. 22, for convenience of description, illustration of the insulating film 1460 and the resin part RES is omitted.

In accordance with one or more embodiments, when the reflective structure RS does not include the adhesive film 1480, an adhesive member 2480 may be separately disposed on the overcoat layer OC. The adhesive member 2480 may be in contact with the reflective structure RS.

After the adhesive member 2480 is disposed on the overcoat layer OC, the adhesive member 2480 may connect the overcoat layer OC and the reflective structure RS to each other. In accordance with one or more embodiments, the adhesive member 2480 has an adhesive property, but it may not be essentially required that the adhesive member 2480 has a light transmission property. For example, the reflective structure can be connected to the overcoat layer OC by the adhesive member 2480, and a reflective surface of the reflective structure RS can be configured to reflect light even when the adhesive member 2480 does not have the light transmission property.

Hereinafter, a manufacturing method of the display device DD in accordance with one or more embodiments of the present disclosure will be described with reference to FIGS. 23 to 31. In FIGS. 23 to 31, descriptions of portions that are the same as or similar to those described above will be simplified or omitted.

FIGS. 23 to 31 are process sectional views illustrating a manufacturing method of a display device in accordance with one or more embodiments of the present disclosure.

First, a manufacturing method of the display device DD in accordance with the first embodiment of the present disclosure will be described with reference to FIGS. 23 to 26. FIGS. 23 to 26 illustrate a manufacturing method of the display device DD in accordance with the first embodiment of the present disclosure. In one or more embodiments, in FIGS. 23 to 26, an embodiment in which a cover part CV is provided as an outer layer DF will be primarily described.

Figure 23:
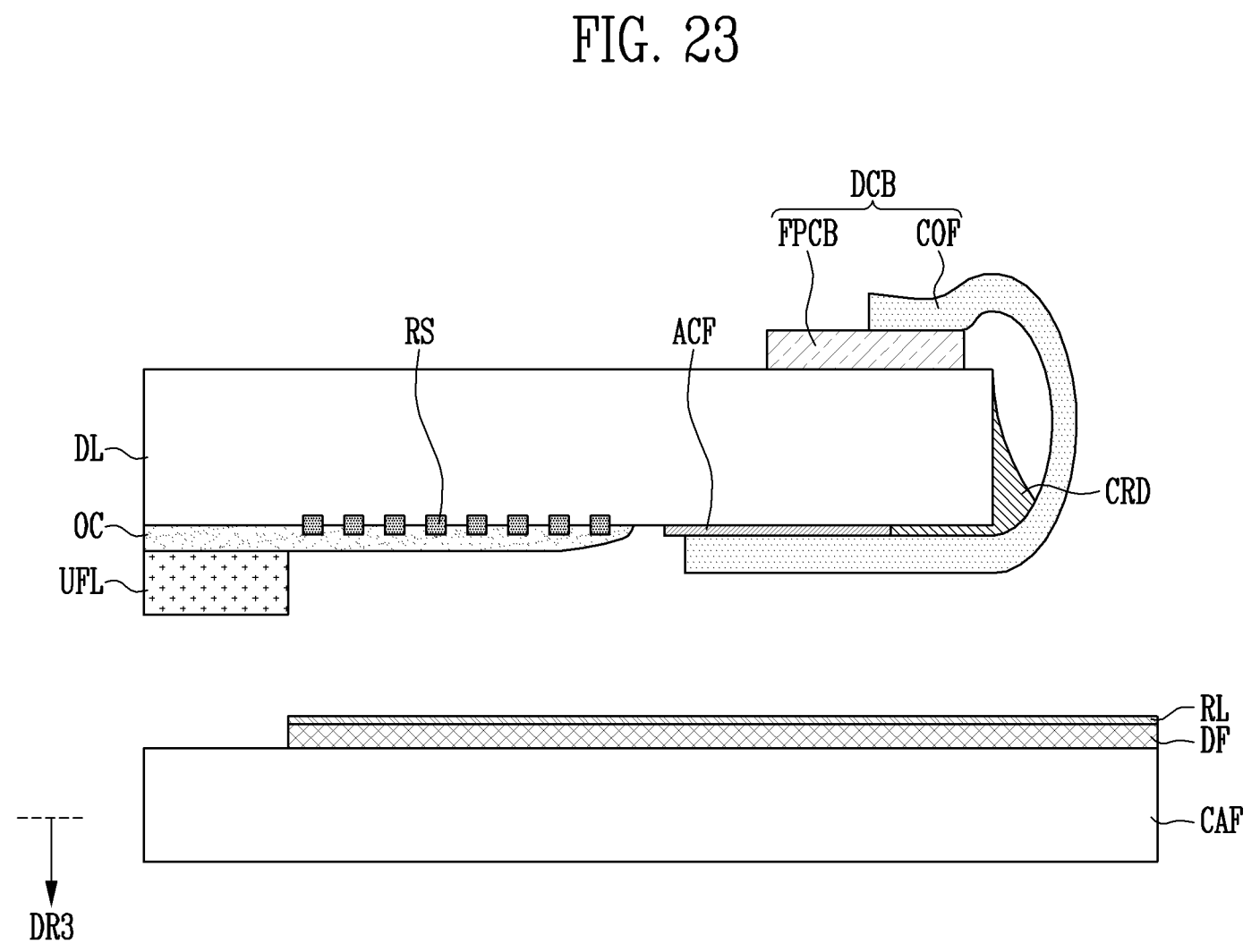

Referring to FIG. 23, a display layer DL may be provided (or prepared), an overcoat layer OC may be disposed on one area of the display layer DL, and an outer film layer UFL may be disposed on the overcoat layer OC. In one or more embodiments, an adhesive layer ACF may be disposed on one area of the display layer DL, and a driving circuit board DCB may be connected to the display layer DL.

In order to provide the display layer DL, a pixel circuit layer PCL and a display element layer DPL may be disposed (or provided) on a substrate SUB. In an example, individual components of the pixel circuit layer PCL may be formed by patterning a conductive layer, an inorganic material, an organic material, and/or the like through a process using an ordinary mask. In one or more embodiments, light emitting elements LD may be disposed after the pixel circuit layer PCL is provided. In accordance with one or more embodiments, the light emitting elements LD may be disposed by using an inkjet process. For example, an ink including the light emitting elements LD may be supplied onto a first electrode ELT1 and a second electrode ELT2. In one or more embodiments, a first alignment signal may be provided to the first electrode ELT1, and a second alignment signal may be provided to the second electrode ELT2. The light emitting elements LD may be aligned according to an electric field based on the first alignment signal and the second alignment signal.

The adhesive layer ACF may be disposed on one area of the display layer DL, on which the overcoat layer OC is not disposed. Also, the adhesive layer ACF may be connected to one surface of a chip on film COF. The one surface of the chip on film COF may be connected to a flexible circuit board FPCB. Lines of the display layer DL may be connected (e.g., electrically connected) to the chip on film COF through the adhesive layer ACF.

The flexible circuit board FPCB may be connected onto a back surface of the display layer DL. In one or more embodiments, in accordance with one or more embodiments, an outer resin part CRD may be disposed on the display layer DL adjacent to an inner surface of the chip on film COF. In one or more embodiments, after the outer resin part CRD is coated adjacent to a side surface of the display layer DL, the flexible circuit board FPCB may be connected onto the back surface of the display layer DL.

A reflective structure RS may be disposed (or provided) on the substrate SUB. The reflective structure RS may be disposed to overlap with a position at which a resin part RES is disposed as a subsequent process is performed. For convenience of description, the reflective structure RS is briefly illustrated in the drawing. The reflective structure RS may be provided by disposing a reflective electrode ELT over an insulating pattern INP after the insulating pattern INP is disposed on a protective layer PSV or the substrate SUB.

The display layer DL including the reflective structure RS may be disposed such that the overcoat layer OC and the reflective structure RS face the bottom thereof. For example, the display layer DL may be overturned such that the overcoat layer OC and the reflective structure RS face in a gravity direction.

In one or more embodiments, a carrier member CAF may be provided (or prepared), and an outer layer DF and a reflective layer RL may be provided on the carrier member CAF. In accordance with one or more embodiments, the carrier member CAF may be a carrier film.

The outer layer DF may be manufactured by sequentially stacking a first outer layer 1220, a second outer layer 1240, and a third outer layer 1260 as described above with reference to FIG. 16. The reflective layer RL may be stacked on the third outer layer 1260 of the outer layer DF.

The manufactured outer layer DF and the reflective layer RL disposed on the outer layer DF may be disposed on the carrier member CAF. The carrier member CAF may be a base member for moving the outer layer DF and the reflective layer RL.

In accordance with one or more embodiments, the outer layer DF and the reflective layer RL, which are disposed on the carrier member CAF, may be disposed to face the display layer DL including the reflective structure RS. For example, the outer layer DF and the reflective layer RL are disposed on one surface of the carrier member CAF, and may be disposed to face in the opposite direction of the gravity direction.

Figure 24:
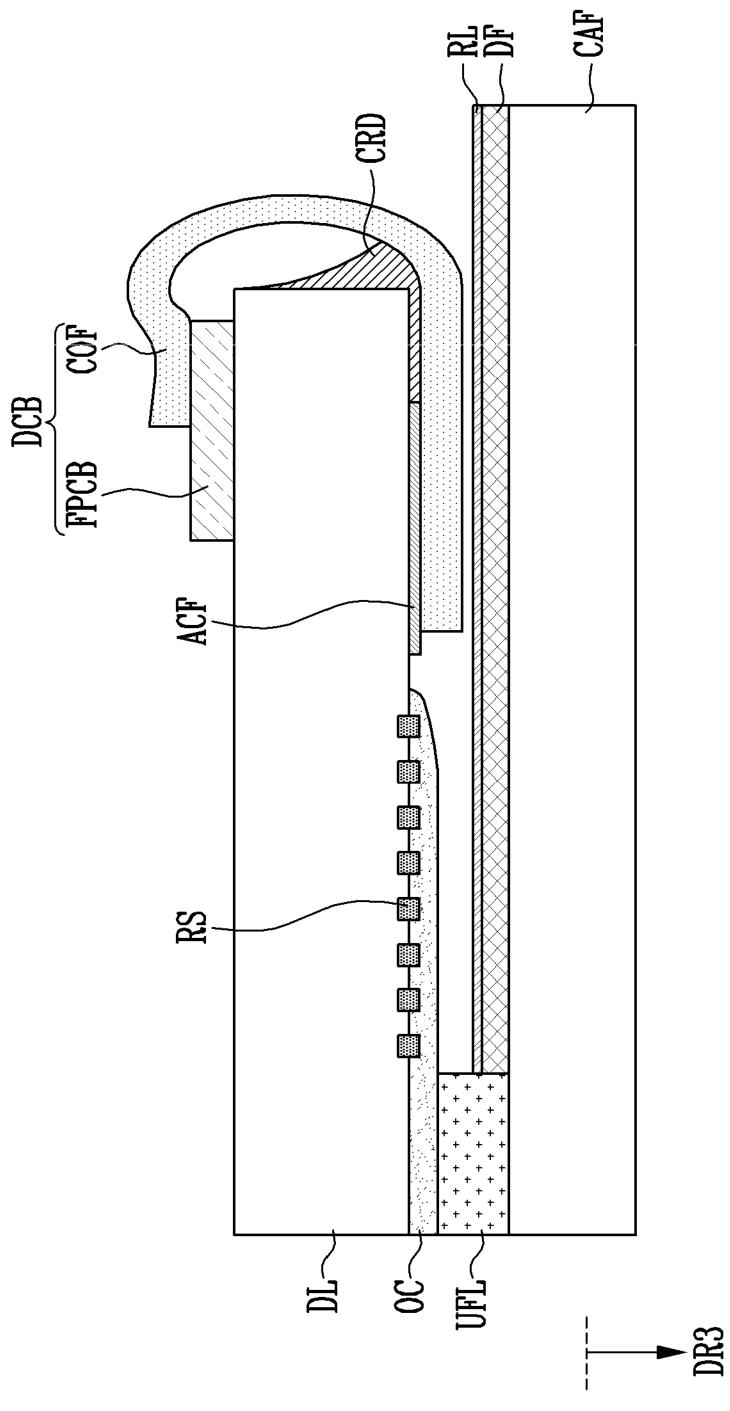

Referring to FIG. 24, the carrier member CAF may be moved, thereby allowing the outer layer DF and the reflective layer RL to be adjacent to the display layer DL. Accordingly, the outer layer DF and the reflective layer RL are adjacent to the overcoat layer OC, and may be spaced from the overcoat layer OC at a set distance (e.g., a predetermined distance).

In one or more embodiments, the carrier member CAF may be moved such that an outer surface of the outer layer DF corresponds to an outer surface of the outer film layer UFL. For example, the outer layer DF may be spaced from the overcoat layer OC at a distance (e.g., a predetermined distance). The distance (e.g., the predetermined distance) may be a distance suitable for the outer surface of each of the outer film layer UFL and the outer layer DF to form a substantially flat plane.

Figure 25:
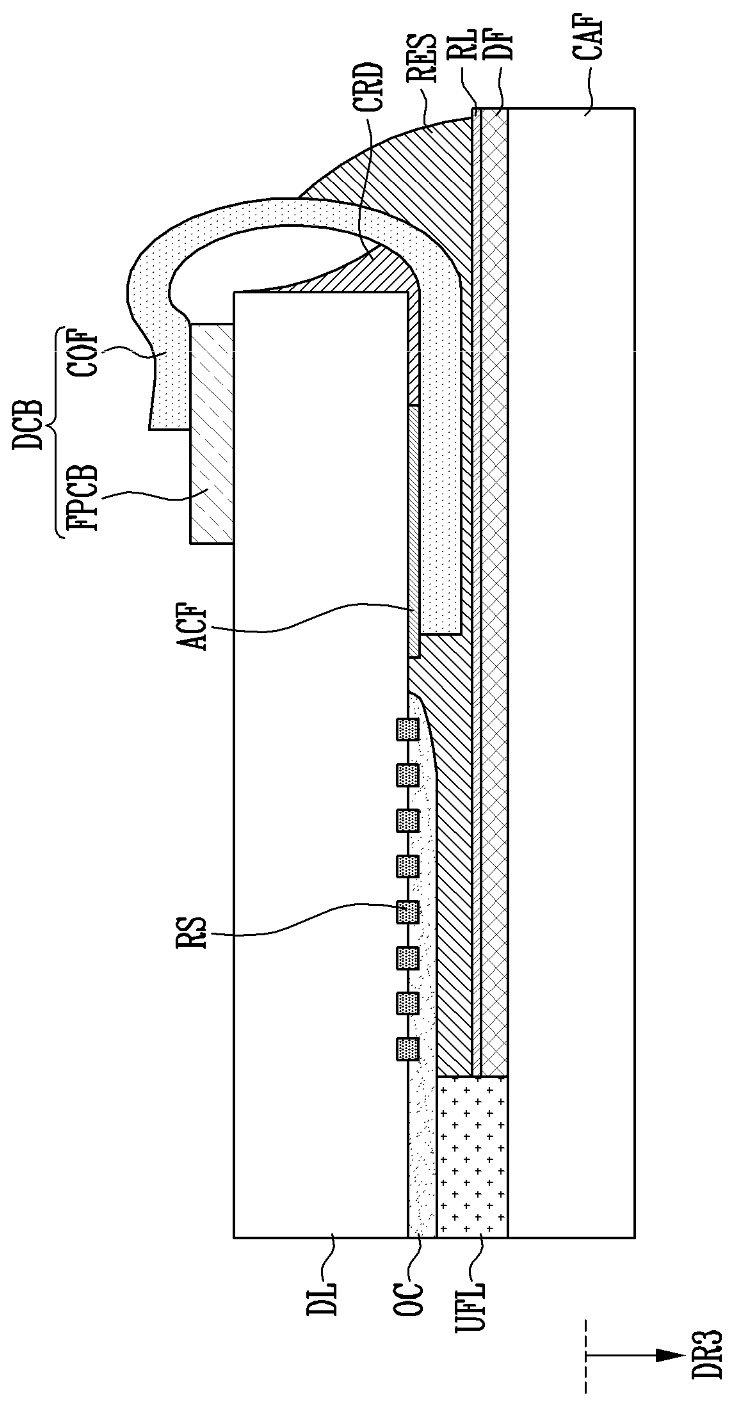

Referring to FIG. 25, the resin part RES may be provided.

The resin part RES may be disposed between the outer layer DF and reflective layer RL, and the display layer DL. The resin part RES may be provided in a space defined between the outer layer DF and the overcoat layer OC. The resin part RES may be provided in various suitable manners. For example, the resin part RES may be discharged by a fluid dispenser. In one or more embodiments, the resin part RES may be sprayed by using a pneumatic valve or a needle type valve. However, the present disclosure is not limited thereto, and the resin part RES may be disposed in various suitable manners.

The resin part RES may be led up to an area overlapping with the overcoat layer OC. For example, the resin part RES may be led along a length direction of the display device DD, to fill an area between the overcoat layer OC and the outer layer DF.

The resin part RES may be disposed between the display layer DL and the outer layer DF. Accordingly, a portion of the resin part RES may be disposed on the overcoat layer OC, and a portion of the resin part RES may be disposed on the chip on film COF. In one or more embodiments, a portion of the resin part RES may contact the overcoat layer OC. In addition, a portion of the resin part RES may be disposed adjacent to the side surface of the display layer DL. Accordingly, the display device DD can be protected from external influence.

Figure 26:
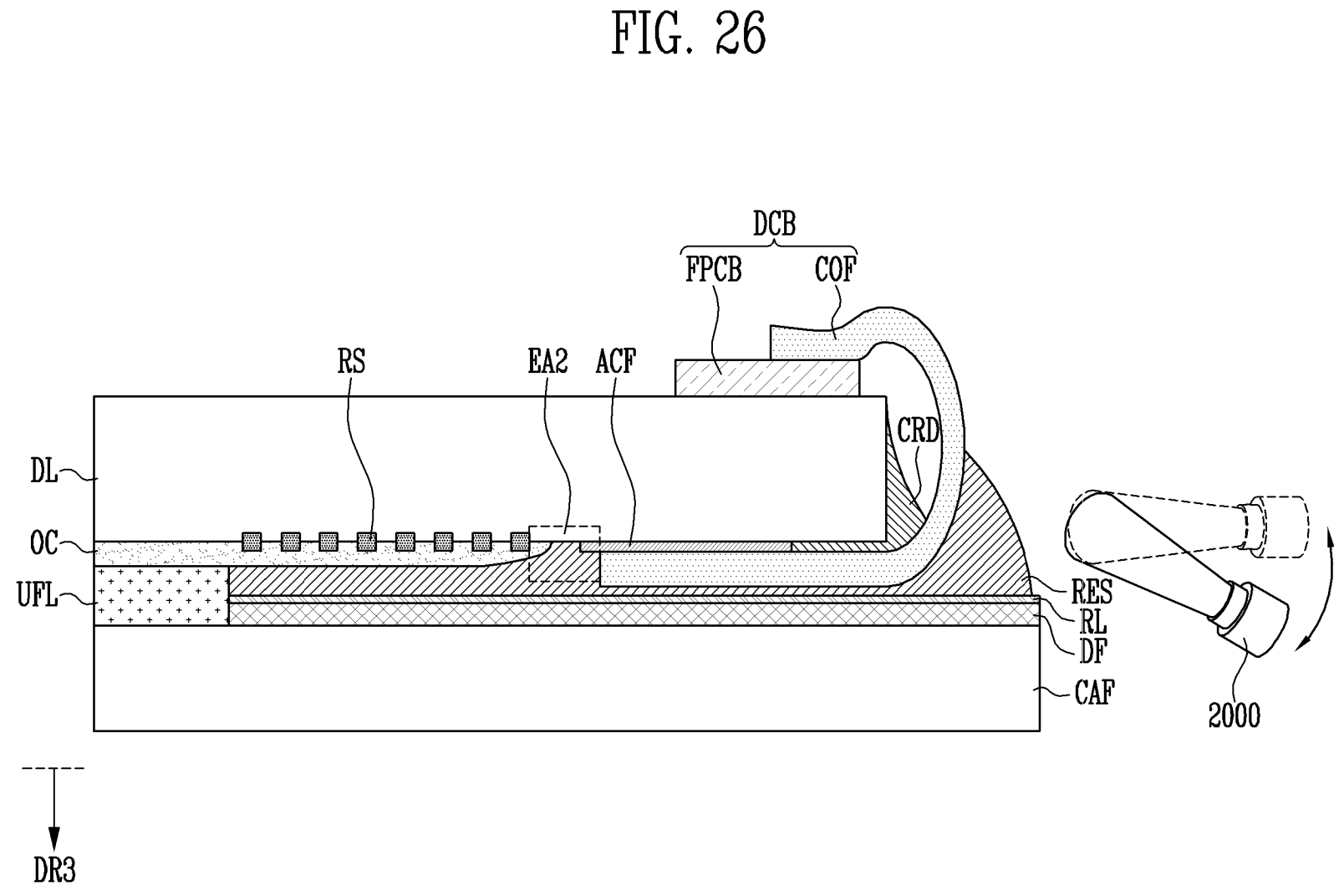

Referring to FIG. 26, the resin part RES may be cured.

In one or more embodiments, a resin curing device 2000 configured to provide ultraviolet (UV) light may be used. For example, the resin curing device 2000 may provide UV light to the provided resin part RES, thereby allowing the resin part RES to have a constant shape (e.g., a fixed shape).

The resin curing device 2000 may be disposed adjacent to a side surface of the display device DD, to emit UV light toward an inner side of the display device DD. For example, the resin curing device 2000 may be disposed at a side at which the driving circuit board DCB is disposed, to emit UV light toward the resin part RES and the overcoat layer OC. The UV light may be provided toward the reflective structure RS from the driving circuit board DCB.

When the resin curing device 2000 provides UV light, the resin curing device 2000 may be moved in a set direction (e.g., a predetermined direction). A position (or pose) of the resin curing device 2000 may be repeatedly changed so that the UV light can be evenly provided to the resin part RES. For example, the resin curing device 2000 may be rotated according to a reference (e.g., a predetermined reference). In one or more embodiments, a path through which the resin curing device 2000 is rotated is indicated by a double-sided arrow in FIG. 26.

In accordance with one or more embodiments, because the reflective structure RS is disposed, UV light for curing the resin part RES may be provided at the whole position of the resin part RES.

Because the adhesive layer ACF and the chip on film COF are disposed on one surface of the display layer DL, a step difference with respect to an area in which the adhesive layer ACF and the chip on film COF are not disposed may be formed. For example, the area in which the step difference is formed is indicated by a step difference area EA2 in FIG. 26.

Because it is difficult for the provided UV light to be provided to the step difference area EA2, there may exist a risk that the resin part RES disposed in the step difference area EA2 will not be sufficiently cured. However, in accordance with one or more embodiments of the present disclosure, the reflective structure RS is disposed at a position adjacent to the step difference area EA2 so that the UV light can be sufficiently supplied to the step difference area EA2. Accordingly, the risk that the resin part RES will not be cured can be resolved or reduced.

Subsequently, the carrier member CAF is released from the outer layer DF so that the display device DD in accordance with one or more embodiments of the present disclosure can be provided.

Next, a manufacturing method of the display device DD in accordance with the second embodiment of the present disclosure will be described with reference to FIGS. 27 to 31. FIGS. 27 to 31 illustrate a manufacturing method of the display device DD in accordance with the second embodiment of the present disclosure. In one or more embodiments, in FIGS. 27 to 31, the structure in accordance with the first embodiment form in the second embodiment of the present disclosure will be primarily described. In FIGS. 27 to 31, descriptions of portions that are the same as or similar to those described above will be simplified or omitted.

Figure 27:
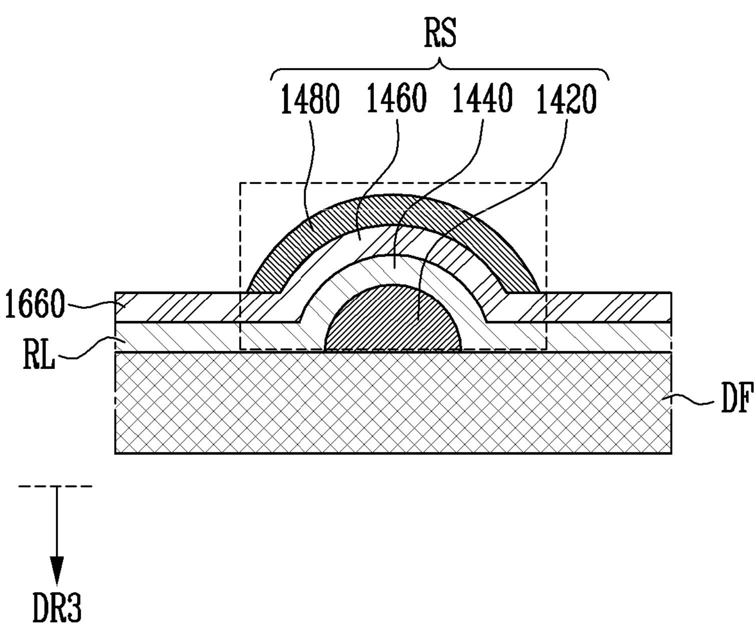

Referring to FIG. 27, a cushion layer 1420, a reflective layer RL, an insulating layer RL, an insulating layer 1660, and an adhesive film 1480 may be sequentially disposed on an outer layer DF, thereby providing a reflective structure RS disposed on the outer layer DF.

In one or more embodiments, the cushion layer 1420 may be disposed to protrude in one direction. Subsequently, the reflective layer RL may be deposited to cover the cushion layer 1420 so that a reflective film 1440 disposed on the cushion layer 1420 is provided. As described above, the reflective film 1440 disposed on the cushion layer 1420 may serve as a reflective partition wall. Similarly, the insulating layer 1660 may be deposited to cover the reflective film 1440 so that an insulating film 1460 disposed on the reflective film 1440 is provided.

Figure 28:
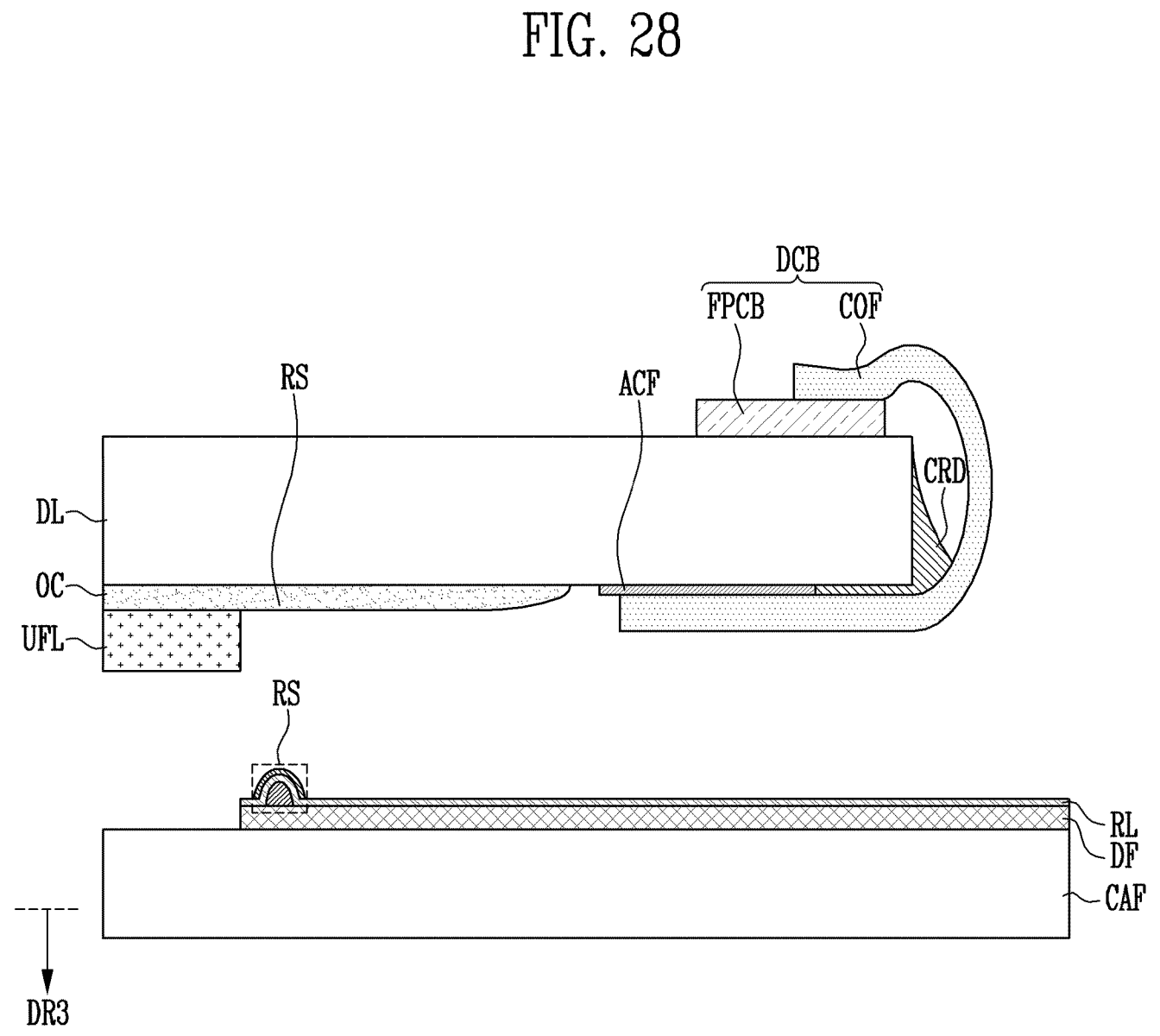

Referring to FIG. 28, the outer layer DF and the reflective structure RS disposed on the outer layer DF may be disposed on a carrier member CAF. As described above, the carrier member CAF may move the reflective structure RS in one direction. In one or more embodiments, the reflective structure RS and an overcoat layer OC may be disposed to face each other.

Figure 29:
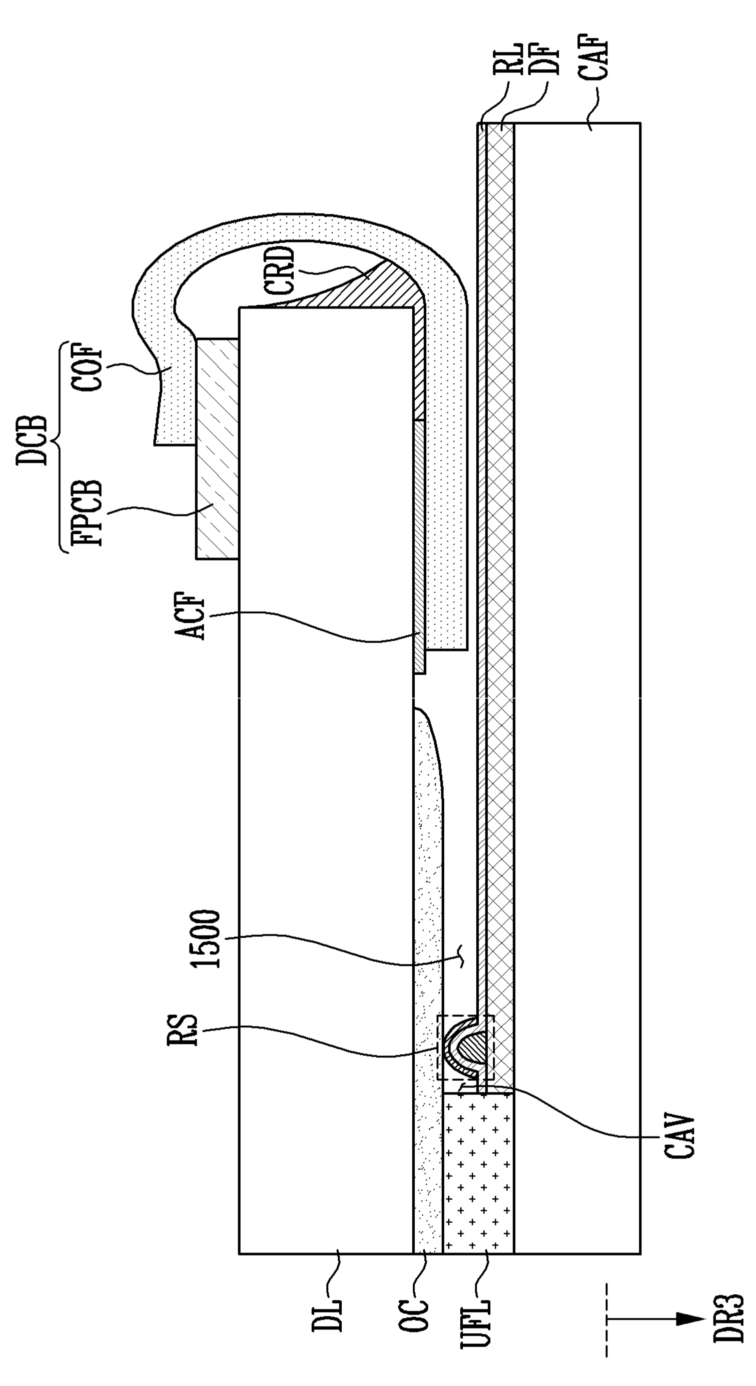

Referring to FIG. 29, the carrier member CAF may be moved, thereby allowing the outer layer DF, the reflective layer RL, and the reflective structure RS to be adjacent to a display layer DL.

In one or more embodiments, a portion of the reflective structure RS may be connected to the overcoat layer OC. The reflective structure RS may be in contact with the overcoat layer OC. For example, as the carrier member CAF is moved, a distance between the reflective structure RS and the overcoat layer OC may be decreased. The carrier member CAF may be moved until an outer surface of the outer layer DF forms the substantially same plane as an outer surface of an outer film layer UFL.

In accordance with one or more embodiments, the cushion layer 1420 of the reflective structure RS has an elastic property so that a step difference caused by the overcoat layer OC can be cancelled. For example, when the overcoat layer OC includes an organic material, an outer surface of the overcoat layer OC may be uneven. In accordance with one or more embodiments of the present disclosure, the uneven surface can be cancelled due to elasticity of the cushion layer 1420, and accordingly, components can be thoroughly connected to each other. Moreover, because the overcoat layer OC and the reflective structure RS are thoroughly connected to each other, the reflective structure RS can separate (e.g., fluidly separate) an area 1500 in which a cavity CAV and a resin part RES are provided. Accordingly, the resin part RES provided as a subsequent process is performed can be further prevented or substantially prevented from being leaked to the cavity CAV.

In one or more embodiments, the cavity CAV may be formed, and be disposed between the outer film layer UFL and the reflective structure RS.

Figure 30:
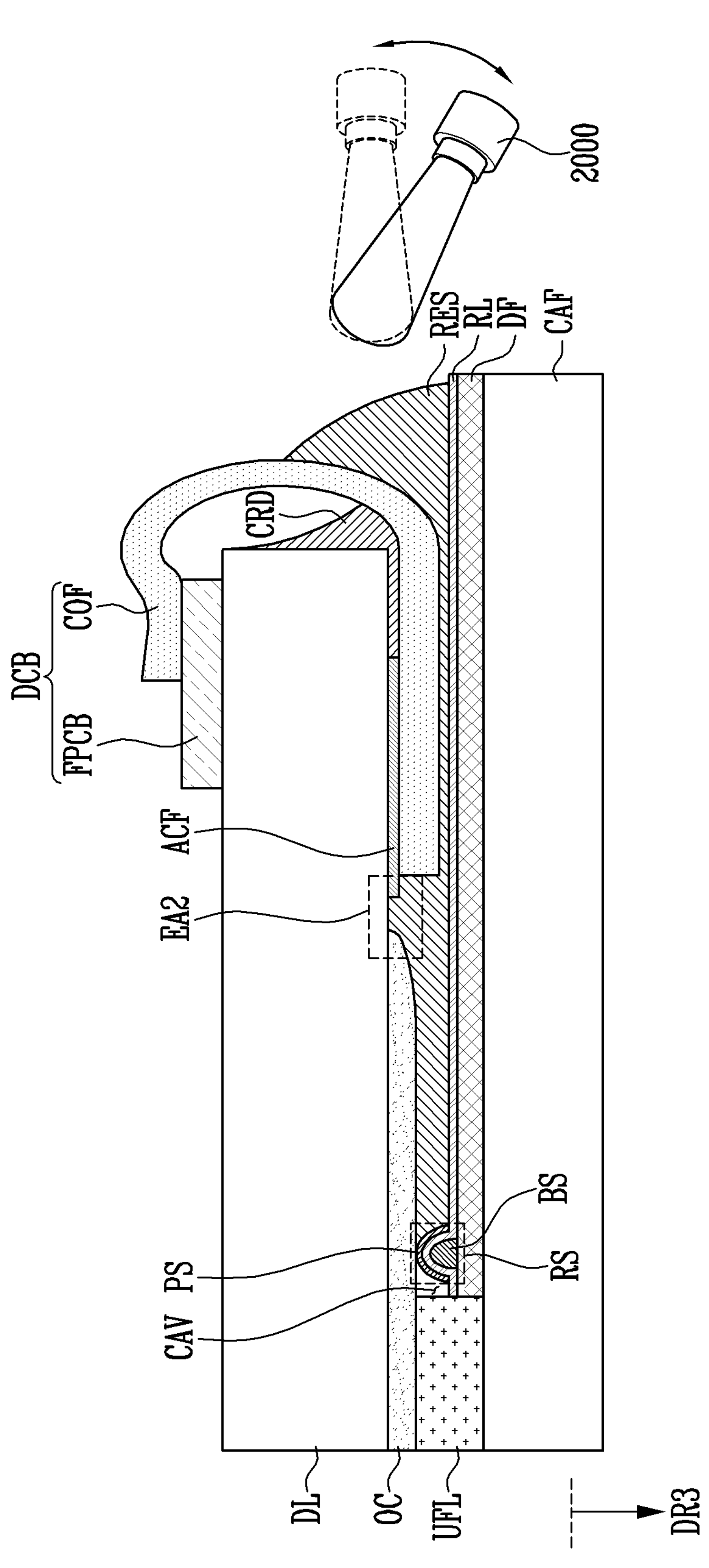

Referring to FIG. 30, the resin part RES may be provided, and the resin curing device 2000 may provide UV light, thereby curing the resin part RES. The resin part RES may be filled in a space defined between the display layer DL and the outer film layer UFL.

In accordance with one or more embodiments of the present disclosure, like as described above with reference to FIG. 26, the resin part RES disposed in a step difference area EA2 can be sufficiently cured. For example, the provided UV light is reflected and diffused into the whole of the resin part RES by the reflective structure RS, and accordingly, a risk that the resin part RES will not be cured can be prevented or substantially prevented.

Subsequently, a carrier member CAF is released from the outer layer DF so that the display device DD in accordance with one or more embodiments of the present disclosure can be provided.

Figure 31:
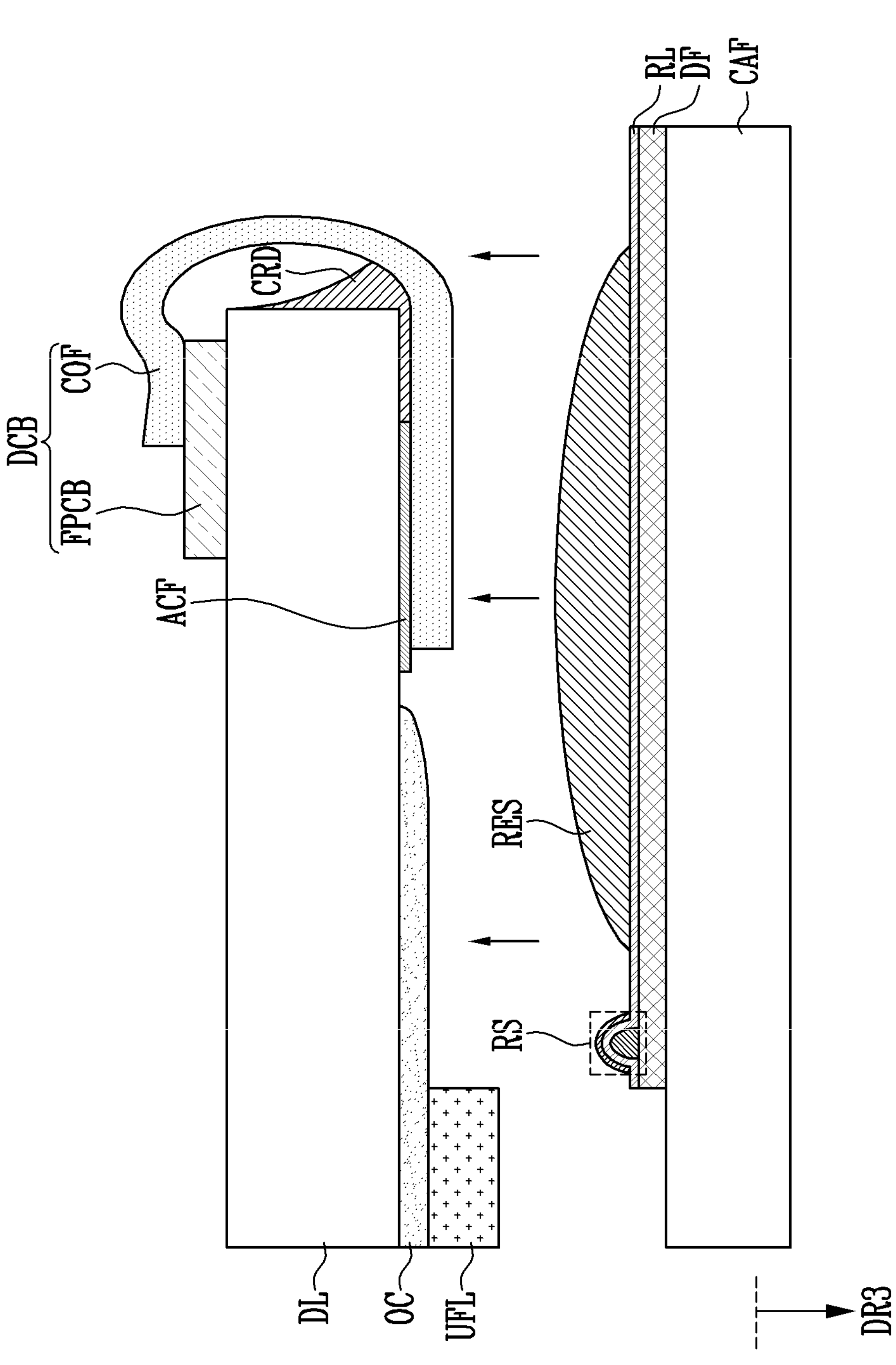

Referring to FIG. 31, in one or more embodiments, the resin part RES may be disposed on the outer layer DF (or the reflective layer RL), before the carrier member CAF is moved. Subsequently, the carrier member CAF may be moved.

For example, the resin part RES may be disposed on the reflective layer RL adjacent to the reflective structure RS, and the carrier member CAF may be moved. As a distance between the display layer DL and the outer layer DF decreases, the shape of the resin part RES may be deformed. As the shape of the resin part RES is deformed, the resin part RES may be diffused into the whole of an area between the display layer DL and the outer layer DF. Subsequently, the resin part RES may be cured.

In accordance with the present disclosure, there can be provided a display device and a manufacturing method thereof, which can prevent or substantially prevent a risk that a resin will be uncured.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various suitable changes in form and details may be made without departing from the features and scope of the present disclosure as set forth in the following claims and equivalents thereof.

What is claimed is:

1. A display device comprising:

a display layer on a substrate, the display layer comprising a light emitting element;

a reflective structure on the display layer;

a resin part on the display layer;

a cover part on the resin part; and a driving circuit board, at least a portion of the driving circuit board being on a side of the display layer, wherein the reflective structure comprises a reflective surface facing the at least the portion of the driving circuit board.

2. The display device of claim 1, further comprising an overcoat layer on the display layer, wherein, in a plan view, the reflective structure overlaps the overcoat layer, the resin part, and the cover part, and wherein, in a plan view, the reflective structure does not overlap with the portion of the driving circuit board on the display layer.

3. The display device of claim 2, wherein the driving circuit board comprises a chip on film having an end connected to the display layer, and a flexible circuit board connected to another end of the chip on film, the flexible circuit board being on a back surface of the display layer, wherein a portion of the chip on film on the display layer is spaced from the display layer to form a step difference area, and wherein a portion of the resin part is in the step difference area.

4. The display device of claim 1, wherein the display device includes a display area and a non-display area, wherein the non-display area includes a fan-out area, wherein the fan-out area is between the display area and the driving circuit board, and wherein the reflective structure overlaps the fan-out area in a plan view.

5. The display device of claim 1, wherein the cover part comprises a chassis.

6. The display device of claim 1, wherein the cover part comprises an outer layer, and wherein the outer layer comprises:

a first outer layer comprising a polymer material;

a second outer layer comprising a light blocking material, the second outer layer being on the first outer layer; and a third outer layer comprising an inorganic material, the third outer layer being on the second outer layer.

7. The display device of claim 1, wherein the reflective structure comprises:

an insulating pattern above the substrate, the insulating pattern protruding in a thickness direction of the substrate; and a reflective electrode on the insulating pattern.

8. The display device of claim 7, wherein the reflective structure comprises a first reflective structure and a second reflective structure adjacent to the first reflective structure, and wherein the reflective electrode of the first reflective structure and the reflective electrode of the second reflective structure are connected to each other.

9. The display device of claim 7, wherein the reflective structure comprises a first transparent electrode layer on the reflective electrode and a second transparent electrode layer on the first transparent electrode layer.

10. The display device of claim 7, wherein an outer surface of the insulating pattern has a curved shape, and wherein the reflective electrode has a shape corresponding to the outer surface of the insulating pattern.

11. The display device of claim 7, wherein an outer surface of the insulating pattern has a polygonal shape, and wherein the reflective electrode has a shape corresponding to the outer surface of the insulating pattern.

12. The display device of claim 7, wherein the display layer comprises:

a pixel circuit layer comprising an auxiliary electrode layer, a gate electrode, and a transistor electrode on the substrate; and a display element layer on the pixel circuit layer, the display element layer comprising the light emitting element, wherein the reflective structure comprises a lower reflective structure on the substrate, and wherein the lower reflective structure comprises a first reflective layer comprising a same material as the auxiliary electrode layer, a second reflective layer comprising a same material as the gate electrode, and a third reflective layer comprising a same material as the transistor electrode.

13. The display device of claim 7, wherein the display layer comprises:

a pixel circuit layer on the substrate, the pixel circuit layer comprising a pixel circuit; and a display element layer on the pixel circuit layer, the display element layer comprising alignment electrodes and the light emitting element, wherein the light emitting element is aligned between the alignment electrodes, and wherein the alignment electrodes and the reflective electrode include a same material.

14. The display device of claim 1, wherein the reflective structure comprises a cushion layer protruding in a thickness direction of the substrate and a reflective film over the cushion layer, the cushion layer having an elastic property.

15. The display device of claim 14, further comprising an overcoat layer on the display layer, wherein the reflective structure further comprises an insulating film on the reflective film and an adhesive film on the insulating film, wherein the adhesive film enables UV light to be transmitted therethrough, and wherein the adhesive film is in contact with the overcoat layer.

16. The display device of claim 15, further comprising:

a reflective layer on the cover part; and an adhesive layer on the reflective layer.

17. The display device of claim 14, wherein the cushion layer has a polygonal shape.

18. The display device of claim 1, wherein the reflective structure comprises a reflective film protruding in a thickness direction of the substrate.

19. The display device of claim 1, wherein the reflective structure comprises an ink structure protruding in a thickness direction of the substrate, the ink structure comprising silver.

20. The display device of claim 1, further comprising:

an overcoat layer on the display layer; and an adhesive member on the overcoat layer, wherein the adhesive member contacts the reflective structure.

21. An electronic device comprising the display device of claim 1.

* * * * *